US011270038B2

(12) United States Patent
Hysong et al.

(10) Patent No.: US 11,270,038 B2
(45) Date of Patent: Mar. 8, 2022

(54) REDUNDANCY DETECTION WITH FUNCTION MODELS

(71) Applicant: Shainin II LLC, Northville, MI (US)

(72) Inventors: Craig Hysong, Saline, MI (US);
Matthew Peterson, Easley, SC (US);
Volodymyr Korotun, Kyiv (UA);
Rylan Sharpe, Northville, MI (US);
Sergio Lizarraga, Chihuahua (MX)

(73) Assignee: Shainin II LLC, Northville, MI (US)

( * ) Notice: Subject to any disclaimer, the term of this patent is extended or adjusted under 35 U.S.C. 154(b) by 227 days.

(21) Appl. No.: 16/564,979

(22) Filed: Sep. 9, 2019

(65) Prior Publication Data

US 2021/0073350 A1 Mar. 11, 2021

(51) Int. Cl.
| | |
|---|---|
| *G06F 30/17* | (2020.01) |
| *G06F 40/205* | (2020.01) |
| *G06F 40/247* | (2020.01) |
| *G06F 40/284* | (2020.01) |

(52) U.S. Cl.
CPC ............ *G06F 30/17* (2020.01); *G06F 40/205* (2020.01); *G06F 40/247* (2020.01); *G06F 40/284* (2020.01)

(58) Field of Classification Search
None
See application file for complete search history.

(56) References Cited

U.S. PATENT DOCUMENTS

| | | | |
|---|---|---|---|
| 7,069,192 B1 | 6/2006 | Freitag | |
| 8,214,423 B2 | 7/2012 | Freitag | |
| 2009/0148050 A1 | 6/2009 | Reghetti et al. | |
| 2009/0273598 A1 | 11/2009 | Reghetti et al. | |
| 2010/0138762 A1 | 6/2010 | Reghetti et al. | |
| 2010/0223032 A1 | 9/2010 | Reghetti et al. | |
| 2014/0040840 A1* | 2/2014 | Hysong | G06F 17/00 716/106 |
| 2014/0343920 A1* | 11/2014 | Srinivasan | G06F 40/211 704/9 |
| 2016/0188297 A1* | 6/2016 | Kuroiwa | G06F 8/10 717/123 |
| 2018/0089242 A1* | 3/2018 | Lev | G06F 16/212 |
| 2018/0189673 A1* | 7/2018 | Dalton | G06N 3/08 |

OTHER PUBLICATIONS

Mefteh, Mariem, Nadia Bouassida, and Hanêne Ben-Abdallah. "Mining feature models from functional requirements." (2016): 1784-1804. (Year: 2016).*
Hysong, et al., Notice of Allowance dated Jul. 8, 2014 for U.S. Appl. No. 13/803,590.
Hysong, et al., Office Action (Quayle) dated Jun. 19, 2014 for U.S. Appl. No. 13/803,590.

* cited by examiner

*Primary Examiner* — Frank D Mills
(74) *Attorney, Agent, or Firm* — Stoel Rives LLP; Jordan B. Olsen

(57) ABSTRACT

Systems and methods for detecting design redundancies and conflicts of a product or process are disclosed in the present application. A system for detecting redundancies and conflicts may parse a plurality of descriptions of functions to identify objects, verbs, and modifiers corresponding to descriptions of the plurality of descriptions. The system may determine lexical relationships between the identified objects, verbs, and modifiers based on lexical relationships. The system may determine dependencies of hierarchal relationships within the function model, and detect redundancies and conflicts based on the lexical relationships and the hierarchal relationships.

20 Claims, 18 Drawing Sheets

| Type | Example Function Model | Functional Interactions Within a Product Function Model | Functional Interactions Within a Process Function Model |
|---|---|---|---|
| Type 1<br><br>A=B Or A≈B | (diagram with nodes A (408) and B (410)) | "Redundancy"<br><br>Same function repeated in multiple places, provides an opportunity to optimize | "Redundancy"<br><br>Same function repeated in multiple places, provides an opportunity to optimize |
| Type 2<br><br>A = -(B)<br>(A is opposite of B) | (diagram with nodes A (412) and B (414)) | "Conflict"<br><br>Opposing functions; two functions in conflict due to opposing verbs acting on the same object. "Maximize thickness" and "Minimize thickness" | "Redundancy"<br><br>Opposing functions; two functions are redundant because one undoes the other "Install door" and "Uninstall door" |
| Type 3<br><br>A=B Or A≈B<br>And α and β are able to occur independently* | (diagram with nodes A (416), B (418), α (420), β (422), and node 424) | "Redundancy"<br><br>Same function repeated in multiple places, provides an opportunity to optimize | "Conflict"<br><br>Confounding functions; attempting to achieve two higher level functions by performing the same operation<br>A = B = "Move rudder"<br>A = "Aim cannons"<br>β = "Steer ship" |

*α and β are defined as the children of the common ancestor of A and B within the lineage of A and B respectively

FIG. 4

┌─────────────────────────────────────────────────────────────┐
│ Parse Function Text                                       X │
│                                                             │
│   Please select the word in the "verb box that is the verb in your function. │
│                                                             │
│   Please select the word(s) in the "Object" box that is/are the object(s) in your │
│   function.                                                 │
│                                                             │
│   Please select the word(s) in the "Modifier box that explain in what manner or │
│   to what extent the function occurs.                       │
│                                                             │
│ Example: "Control material thickness" → verb = control, noun = thickness │
│ Example: "Control surface finish" → verb = control, noun = surface + finish │
│                                                             │
│        VERB              NOUN              Modifier         │
│   ┌──────────────┐  ┌──────────────┐  ┌──────────────┐      │
│   │ Prevent      │  │ Prevent      │  │ Prevent      │      │
│   │ Diaphragm    │  │ Diaphragm    │  │ Diaphragm    │      │
│   │ Material     │  │ Material     │  │ Material     │      │
│   │ Fatigue      │  │ Fatigue      │  │ Fatigue      │      │
│   │              │  │              │  │              │      │
│   └──────────────┘  └──────────────┘  └──────────────┘      │
│                                                             │
│           ┌───────────────┐       ┌───────────┐             │
│           │ Next Function │       │  Cancel   │             │
│           └───────────────┘       └───────────┘             │
└─────────────────────────────────────────────────────────────┘

FIG. 8

| Function 1 | Function 2 | Function 1 Distilled Text | Function 2 Distilled Text | Type (Product) | Type (Process) |
|---|---|---|---|---|---|
| 2 | 3 | decrease compression | increase compression | Conflict | Redundancy |
| 2 | 1.1.2 | decrease compression | maximize compression | Conflict | Redundancy |
| 2 | 1.3.2 | decrease compression | maximize compression | Conflict | Redundancy |
| 2 | 1.2.2.1 | decrease compression | minimize compression | Redundancy | Redundancy |
| 2 | 1.2.2.8 | decrease compression | minimize compression | Redundancy | Redundancy |
| 3 | 1.1.2 | increase compression | maximize compression | Redundancy | Redundancy |
| 3 | 1.3.2 | increase compression | maximize compression | Redundancy | Redundancy |
| 3 | 1.2.2.1 | increase compression | minimize compression | Conflict | Redundancy |
| 3 | 1.2.2.8 | increase compression | minimize compression | Conflict | Redundancy |
| 1.1 | 1.3 | contain fuel | contain fuel | Redundancy | Redundancy |
| 1.3 | 1.1 | contain fuel | contain fuel | Redundancy | Redundancy |
| 1.1.1 | 1.3.1 | control compression | control compression | Redundancy | Redundancy |
| 1.1.2 | 3 | maximize compression | increase compression | Redundancy | Redundancy |
| 1.1.2 | 1.3.2 | maximize compression | maximize compression | Redundancy | Redundancy |
| 1.1.2 | 1.2.2.1 | maximize | minimize compression | Conflict | Redundancy |

FIG. 11

REDUNDANCY DETECTION WITH FUNCTION MODELS

TECHNICAL FIELD

The present application is directed to redundancy detection in a system design and more particularly relates to redundancy detection based on a function model of the system.

BRIEF DESCRIPTION OF THE DRAWINGS

FIG. 4 is a chart of types of redundancies and conflicts that a redundancy and conflict detection system may detect.

FIG. 8 illustrates a graphical user interface that allows a user to assist in the parsing of a function model.

FIG. 11 illustrates an output of a redundancy and conflict detection system according to one embodiment.

DETAILED DESCRIPTION OF PREFERRED EMBODIMENTS

Figure 1:
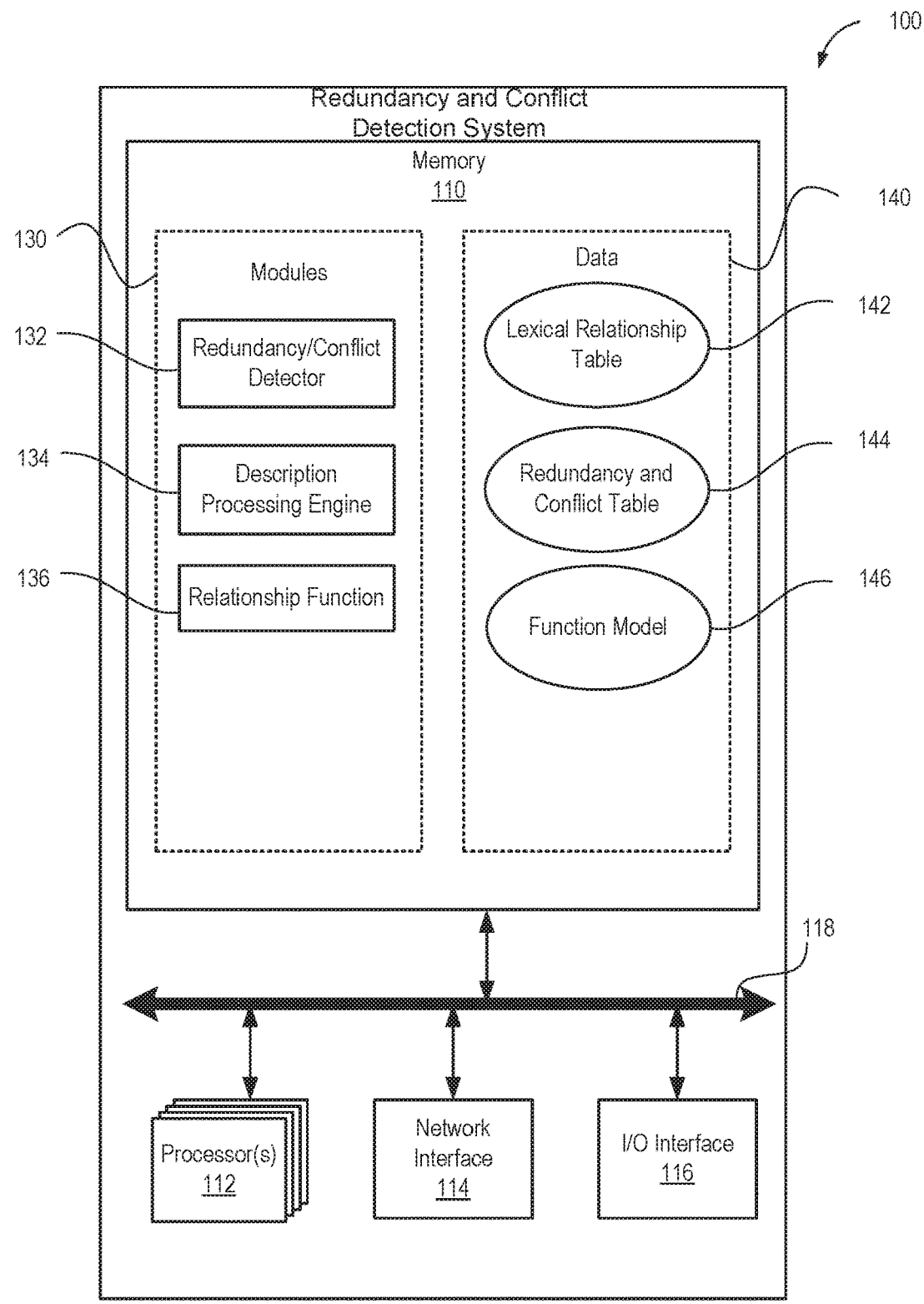
FIG. 1 is a block diagram illustrating a redundancy and conflict detection system for redundancy and conflict detection in a design of a system, device, or process, according to one embodiment.

Research and development for new systems, devices, or methods can be extremely expensive and time consuming. One cause of high cost and lengthened research and development periods is the perpetuation of conflicts, redundancies, or other problems in a design. For example, design redundancies may be introduced in the early stages of designing a system, product, or process but may not be recognized until prototypes have been built or until significant time and effort has been put into developing or testing the design.

As an engineering design project progresses, the ability to make changes to the design decreases and the costs associated with making those changes increase. Thus, it is important to identify potential problems with conceptual designs early in the design project process.

A design conflict or redundancy may be defined as an undesired interaction or relationship between parts, properties, processes, features, shapes, functions, motions, etc. in a design that, if it were removed or diminished, would allow the designed system to perform better, last longer, be easier to manufacture or use, etc. The following definitions further define different types of functional interactions. The classification of a functional interaction as either a functional conflict or a functional redundancy may also depend on the nature of the function model. Therefore, definitions for process function models and product function models within the design space of a physical system are also described below.

A function is a descriptive statement which includes a verb and a noun. The noun may represent an object within the function model. In some embodiments, a function may include a verb, an object, and an optional modifier which explains how or to what extent the function is performed. In some embodiments, the object may comprise multiple words.

A function model is a visual representation of the decomposition of a function into its sub-functions, often organized as a function tree. A function model may be either a product function model or a process function model.

A functional interaction is any relationship between two functions within a function model that is not one of the hierarchical relationships of the function model.

A functional conflict or design conflict is a functional interaction where the execution of one of the interacting functions inhibits the execution of the other interacting function. Functional conflicts are two functions which are at odds with one another. One example of a design conflict in automotive electronic power steering systems is the conflict between the desire for the steering to feel stiff and the minimization of road noise. If stiff steering is achieved the system transmits more undesired road noise. To minimize road noise, the steering must be loose. Thus, "stiff feeling steering" is in conflict with "minimizing road noise."

A functional redundancy or design redundancy is a functional interaction where the two interacting functions are synonymous with one another, either because they are exact duplicates or because the meaning of the two interacting functions are the same.

Even in situations where design conflicts and redundancies cannot be completely removed, understanding and recognizing potential problems, redundancies, or conflicts early on in the design process can lead to significantly better results and cost savings due to a reduced number of unforeseen problems arising late in a design process.

Generally, design conflicts and redundancies have been identified through the skill and luck of a designer, others reviewing the design, and/or the usage of prototypes. However, it has been difficult to identify or detect design conflicts and redundancies, especially early on in the design process. As engineering services are expanded into broader and more complex products and processes, the designs and systems become exponentially more complex. A structured methodology is needed to ensure design conflicts are detected proactively and as early as possible.

The present disclosure discusses systems and methods to accelerate the design of a system, product, or process by identifying design conflicts, design redundancies, potential design conflicts, and potential design redundancies conceptually early on in the development process. Examples of conflict types that may be identified include requirement conflicts, potential tolerance conflicts, and other types of conflict. Such embodiments save time and costly iterations in the development process by finding and addressing design conflicts and redundancies proactively and at stages where the costs of changing a design are reduced.

According to one embodiment, a method disclosed herein includes analyzing a function model to identify specific noun/verb/modifier relationships that could signify a design or tolerance conflict or redundancy between functions or components of a product or process. Once the conflict or redundancy is discovered, the changes can be made to decouple the conflicting relationships or eliminate the redundant relationships without the need for the expensive processes of building or testing a product. In addition to evaluating the conflicts of a single design, there is the need to evaluate multiple competing designs to determine which design is best for the market place.

FIG. 1 is a block diagram illustrating a redundancy and conflict detection system 100 for redundancy and conflict detection in a design of a system, device, or process, according to one embodiment. The redundancy and conflict detection system 100 includes a memory 110, one or more processors 112, a network interface 114, and an input/output (I/O) interface 116.

The processor 112 may be used to process executable code and data stored in the memory 110. The memory 110 may include static RAM, dynamic RAM, flash memory, one or more flip-flops, or other electronic storage medium. The electronic memory 110 may include a plurality of modules 130 and data 140. The modules 130 may run multiple operations serially, concurrently or in parallel on the one or more processors 112.

In some embodiments, portions of the disclosed modules, components, and/or facilities are embodied as executable instructions embodied in hardware or in firmware, or stored on a non-transitory, machine-readable storage medium. The instructions may comprise computer program code that, when executed by a processor and/or computing device, cause a computing system to implement certain processing steps, procedures, and/or operations, as disclosed herein. The modules, components, and/or facilities disclosed herein may be implemented and/or embodied as a driver, a library, an interface, an API, FPGA configuration data, firmware (e.g., stored on an EEPROM), and/or the like. In some embodiments, portions of the modules, components, and/or facilities disclosed herein are embodied as machine components, such as general and/or application-specific devices, including, but not limited to: circuits, integrated circuits, processing components, interface components, hardware controller(s), storage controller(s), programmable hardware, FPGAs, ASICs, and/or the like.

In one embodiment, the modules 130 include a redundancy and conflict detector 132. The redundancy and conflict detector 132 may include executable code and/or other data that can be processed by the processor 112. The redundancy and conflict detector 132 may be used to detect design redundancies and conflicts in a system, product, process or other conceptual design. The redundancy and conflict detector 132 may determine lexical relationships between the objects, verbs, and modifiers based on lexical identifiers stored in the memory, and determine dependencies of hierarchal relationships within the function model to detect several redundancy types and conflict types within a function model 146. In some embodiments, the redundancy and conflict detector 132 may determine what type of redundancy or conflict is present based on whether the function model 146 is a product function model or a process function model.

The description processing engine 134 processes a function model of a system, product or process to identify descriptions of functions of the system, product, or process or functions of parts or components of the system, product, or process. The description processing engine 134 may identify descriptions based on a format of the data structure, by processing text within the function model to identify separate functions, or the like.

The description processing engine 134 may process the function model in preparation for processing by other components of the redundancy and conflict detection system 100. For example, the description processing engine 134 may parse the function model into a number of different descriptions that can then be processed by other components. In one embodiment, the description processing engine 134 parses each description into separate parts. For example, the description processing engine 134 may parse each description into a design component name or object, an active verb, and a modifier. The description processing engine 134 may search each description for a term from one or more of the bill of material or object list, a verb list, and modifier list to locate any objects, verbs, or modifiers in the description.

In one embodiment, the description processing engine 134 identifies descriptions of the function model and places them within an alternate format, such as a table format, a function map format, a graphical format, or any other graphical structure or data structure. For example, the description processing engine 134 may parse the function model into separate descriptions and/or parse the descriptions into separate terms. These parsed versions of the function model and/or descriptions may then be processed by the redundancy and conflict detector 132, relationship function 136, or other components.

The relationship function 136 may track information regarding descriptions and relationships between the descriptions. The relationship function 136 may track redundancies, conflicts, errors, the use of terms, and/or other aspects of the descriptions. For example, the relationship function 136 may record information indicating the existence of a redundancy, conflict, or error based on the redundancy and conflict detector 132 detecting redundancies, conflicts, or errors. The relationship function 136 may also detect other types of relationships or perform other types of analysis on descriptions or function models to detect other information that may be of use to designers.

In one embodiment, the relationship function 136 maintains a lexical relationship table 142. The relationship table 142 includes a set of lexical identifiers that classify objects, verbs, and modifiers as synonyms, antonyms, or not related. The relationship table 142 may be used by the redundancy and conflict detector 132 to determine a relationship between two different descriptions as having a conflict or redundancy.

In some embodiments, the relationship function 136 may flag and record conflicts and redundancies identified by the redundancy and conflict detector 132. For example, relationship function 136 may record information in a redundancy and conflict table 144, relationship table, function model map, or function model schematic in response to the redundancy and conflict detector 132 detecting a redundancy or conflict. In one embodiment, the relationship component 306 may flag relationships as different redundancy, conflict, error, or other types based on the conflict, error, or other type detected by the redundancy and conflict detector 132.

The relationship function 136 may also manage the redundancy and conflict table 144. The relationship function 136 may modify the redundancy and conflict table 144 based on instructions or information provided by other components, such as the description processing engine 134 and the redundancy and conflict detector 132. For example, the relationship function 136 may modify values and/or an appearance of cells of the redundancy and conflict table 144 in response to the redundancy and conflict detector 132 detecting a conflict or the description processing engine 134 identifying a description.

The data 140 stored on the memory 110 may include the data 140 generated by the redundancy and conflict detection system 100, such as by the modules 130 or other modules. The data 140 stored may be organized as one or more memory registers/addresses, files, and/or databases. The data 140 may include a lexical relationship table 142, a redundancy and conflict table 144, and a function model 146. The lexical relationship table 142 may include a set of lexical identifiers that identify objects, verbs, and modifiers as synonyms, antonyms, or not related. The redundancy and conflict table 144 may include detected and flagged redundancies and conflicts in a function model 146. The function model 146 of a product or process may include a plurality of descriptions of functions to be performed by the product or process, the function model identifying dependencies between the functions.

The network interface 114 may facilitate communication with other computing devices and/or networks, such as the Internet and/or other computing and/or communications networks. The network interface 114 may be equipped with conventional network connectivity. The network interface 114 may be a wireless network interface, equipped with conventional wireless network connectivity technologies.

The I/O interface 116 may facilitate interfacing with the redundancy and conflict detection system 100. For example, the I/O interface 116 may receive the function model 146. In some embodiments, the I/O interface 116 may include a display to display information regarding redundancies and conflicts of the function model 146.

A system bus 118 may facilitate communication and/or interaction between the other components of the redundancy and conflict detection system 100, including the memory 110, the one or more processors 112, the network interface 114, and the I/O interface 116.

As can be appreciated, in other embodiments, the redundancy and conflict detection system 100 may be simpler than shown or described. For example, certain designs may forgo one or more components, such as memory, multiple processors, multiple interfaces, and the like, and instead execute instructions closer to or on bare metal (e.g., without intervening operating system or other software layer, executing instructions directly on logic hardware).

Figure 2:
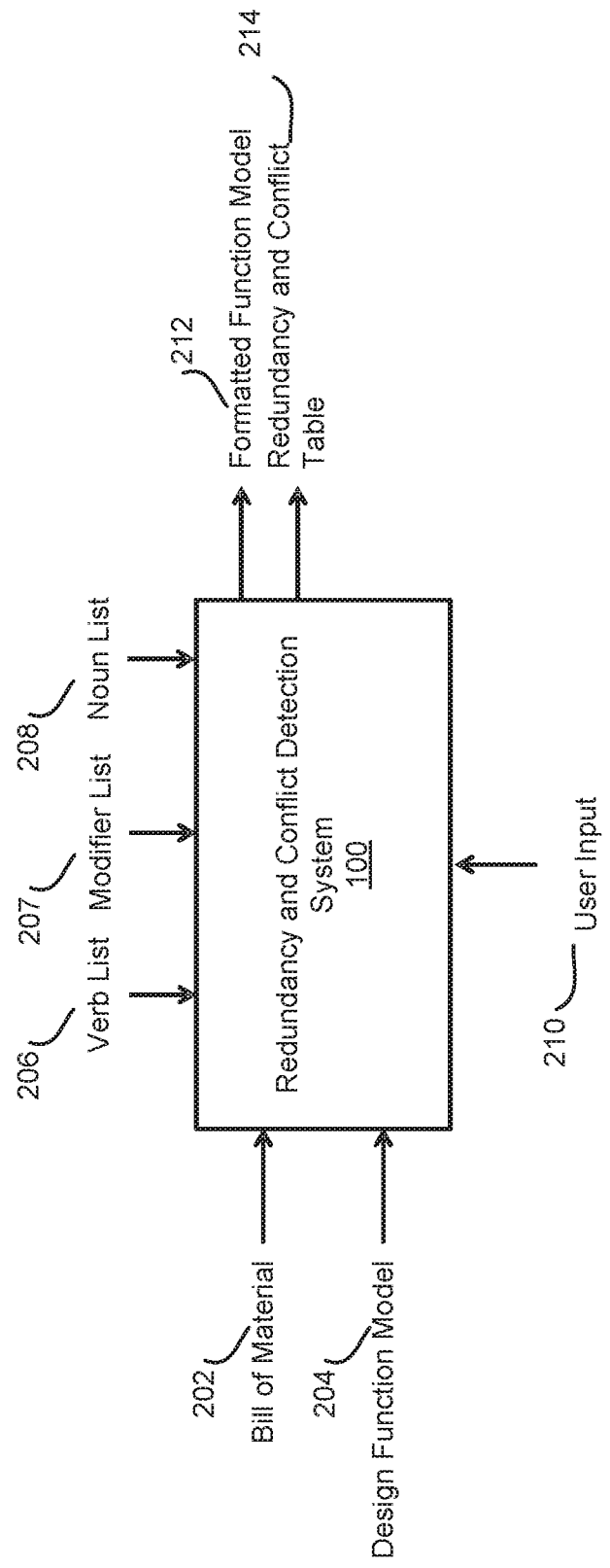
FIG. 2 is a block diagram illustrating example inputs, reference information, and outputs of the redundancy and conflict detection system.

FIG. 2 is a block diagram illustrating example inputs, reference information, and outputs of the redundancy and conflict detection system 100. The inputs may include a bill of material 202, a design function model 204, a verb list 206, a modifier list 207, a noun list 208, and any user input 210.

The bill of material 202 includes a list of components that make up a system, process or product. The term bill of material is given to include any list of materials or components that make up a system, process, or product. For example, a bill of material may include all the components and materials needed to manufacture, assemble, or create a product. The term bill of material is also used herein to include a bill of process that describes a process for how a product or system is assembled. Similarly, the term bill of material may be used to reference a list of components, steps, or functions that make up a process. The bill of material 202 may include design component names for each entry in the bill of material. The design component names may uniquely reference each part of the system, product, or process and/or the tools used to manufacture or assemble a system or product. In some embodiments, the bill of material 202 may be added to the noun list 208.

The user input 210 may be input from a user to select a bill of material 202, design function model 204, verb list 206, modifier list 207, and/or noun list 208 to be used by the redundancy and conflict detection system 100 in detecting conflicts. A user may also be able to provide input to initiate conflict detection, save results, modify a function model or bill of material, or the like.

The reference information for the redundancy and conflict detection system 100 includes a verb list 206, modifier list 207, and/or standard noun list 208. The verb list 206, modifier list 207, and/or noun list 208 may include terms that are recognized as active verbs, modifiers, descriptive nouns, and objects. For example, the conflict detection system 100 may use the lists 206, 207, and 208 to identify active verbs, modifiers, or descriptive nouns within a description of the design function model 204.

The redundancy and conflict detection system 100, according to the depicted embodiment, outputs a formatted function model 212, and a redundancy and conflict table 214. Each of the outputs 212, 214 may be outputted in a file format, visually on a display, or in any other manner. The formatted function model 212 may be a modified version of the design function model 204.

In one embodiment, the redundancy and conflict detection system 100 modifies the design function model 204 to include design component names from the bill of material 202, terms from the verb list 206, terms from the modifier list 207, and/or terms from the noun list 208. For example, the redundancy and conflict detection system 100 may modify the function model to include design component names from a bill of material. Similarly, the redundancy and conflict detection system 100 may display the formatted function model 212 in a variety of different configurations, such as a function model map configuration or function model schematic configuration.

The redundancy and conflict table 214 may include a table that includes descriptions from the design function model 204 and information regarding any redundancies and/or conflicts between the descriptions. The redundancy and conflict table 214 may be displayed on a graphical user interface on a display device. A user may refer to the redundancy and conflict table 214 to reference identified redundancies and/or conflicts.

A design function model 204 is a representation of the functions of parts or components of a system, device, or process. The design function model 204 includes descriptions of at least some of the functions to be performed by the system, product or process and is structured to identify dependencies between the different functions. In one embodiment, the design function model 204 includes a structure that describes how, why, and when respective functions are performed. For example, descriptions of functions that are performed for a specific purpose may depend from a description of the specific purpose. In one embodiment, design function models 204 may be graphically displayed with descriptions at nodes with the location of the node and connectors between nodes indicating dependencies between the nodes.

Figure 3:
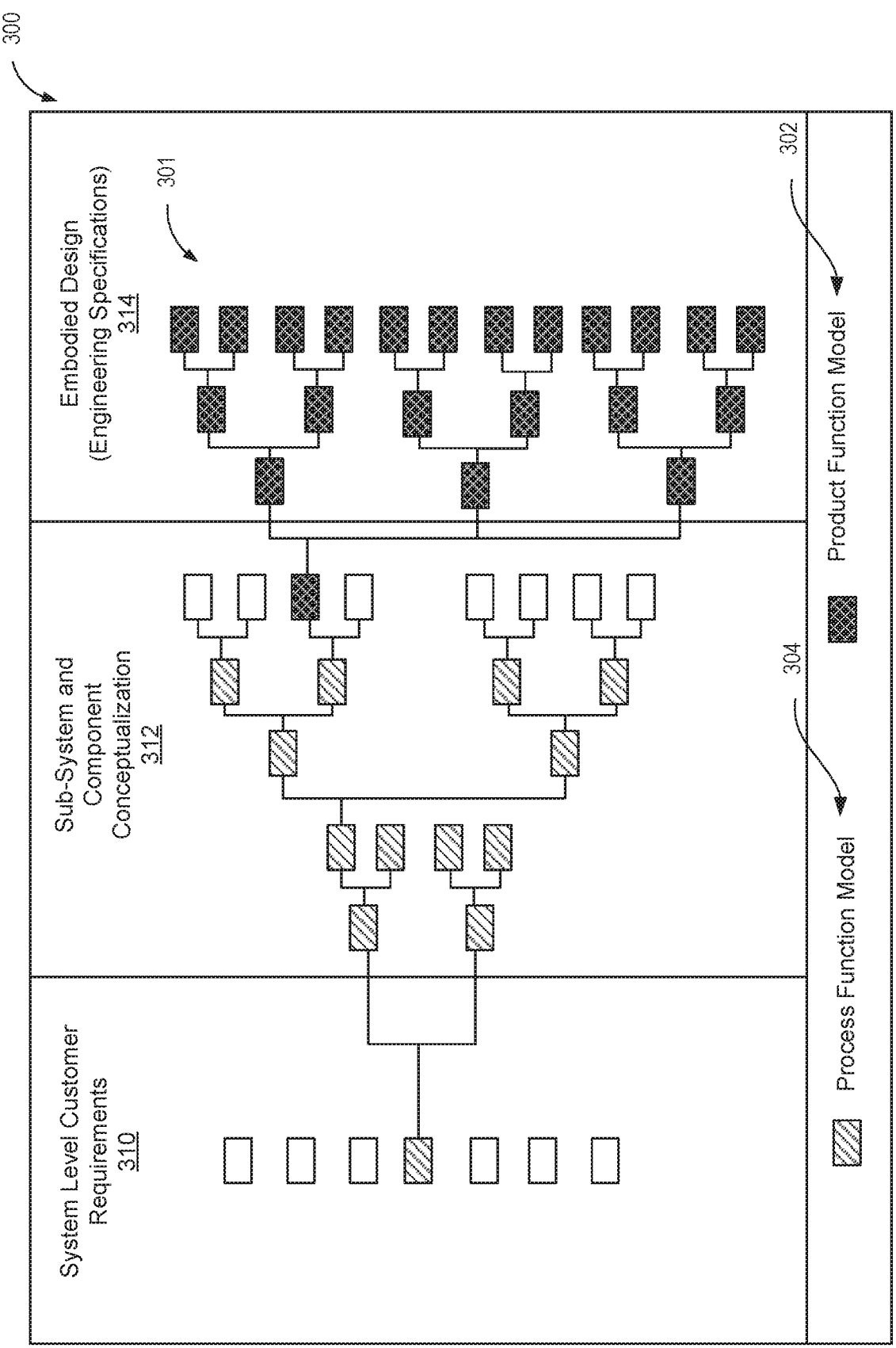
FIG. 3 is a function model comprising product function models and process function models.

FIG. 3 is a function model 301 comprising product function models 302 and process function models 304. FIG. 3 illustrates a relationship between product function models 302 and process function models 304 within a design space 300 of a physical system.

As shown, the design space 300 may be divided up into multiple stages. The illustrated embodiment includes a system level customer requirements stage 310, a sub-system and component conceptualization stage 312, and an embodied design stage 314. Each stage may include one or both of the product function models 302 and process function models 304. Also, as shown, the product function models 302 and process function models 304 may be hierarchically connected. Thus, product function models 302 may flow into process function models 304 or vice versa.

The product function models 302 comprise function models which describe the functions to be achieved by an artifact or component. A product function model may be decomposed from the functional requirements of the component to the functions describing the features of the component's design.

The process function models 304 comprise function models that describe the operation of a physical system (such as an automobile). A process function model is a function model which describes the operation of an artifact, usually beginning at the customer or system level with the performance related requirements of the artifact and extending either to the intermediate requirements of the overall system or all the way to the functions describing the critical features of each component's design within the system. A process function of a process (such as an assembly process or any other process where the sequence and information contained in the steps are the focus rather than the performance of a physical system) expands the ultimate function into the constituent functions to be achieved for the entire process to be considered a success.

FIG. 4 is a chart 400 of types of redundancies and conflicts that a redundancy and conflict detection system may detect. Based on the conditions outlined in the chart 400, the redundancy and conflict detection system may determine that a product function model or process function model has a type 1 functional interaction 402, type 2 functional interaction 404, or type 3 functional interaction 406.

Functional interactions may be classified into three primary types and are referred to as either a functional conflict or a functional redundancy based on the type of functional interaction and the type of function model. FIG. 4 provides the criteria for classification with explanations of each type of functional interaction for both product and process function models.

A redundancy and conflict detection system may detect the type 1 functional interaction 402 by determining that a first object, a first verb, and a first modifier of a first description 408 have a synonymic lexical relationship with a second object, a second verb, and a second modifier of a second description 410. Further, the redundancy and conflict detection system may determine whether direct descendants of a common ancestor of the first description and the second description are dependent upon one another. In other words, if the uncles of the first description 408 and the second description 410 occur dependently and the first description 408 and the second description 410 perform a matching or similar function, the redundancy and conflict detection system flags the relationship as a type 1 function interaction 402.

The type 1 function interaction 402 is a redundancy whether the function model is a product function model or a process function model. Redundancies are functional interactions where the two interacting functions are exact duplicates or near duplicate functions which are meant to represent the same function. For product function models, a redundancy is a function which is required to fulfill multiple different requirements, and thus will appear in multiple different places within the function model. Examples include "maximize" and "minimize" type functions, such as "minimize weight" or "maximize strength."

A redundancy and conflict detection system may detect the type 2 functional interaction 404 by determining that a third object of a third description 412 matches a fourth object of a fourth description 414 and that a third verb of the third description 412 has an antonymic lexical relationship with a fourth verb of the fourth description 414. Additionally, to determine whether the type 2 functional interaction 404 is a conflict or a redundancy, in some embodiments, the redundancy and conflict detection system may detect whether the function model is the process function model, or a product function model.

A type 2 functional interaction 404 may be a conflict if the function model is a product function model. A type 2 conflict exists when two functions in a product function model are at odds with one another. That is, the two functions operate on the same "object" or noun, but with verbs that are antonymous. Examples would include "maximize compression" and "minimize compression."

A type 2 functional interaction 404 may be a redundancy if the function model is a process function model. A type 2 redundancy exists when two functions in a process function model are at odds with one another. That is, the two functions describe operations which are contradictory to one another, indicated by antonymous verbs and identical objects. Examples include "install seal" and "remove seal."

A redundancy and conflict detection system may detect the type 3 functional interaction 406 by determining that a fifth object, a fifth verb, and a fifth modifier of a fifth description 416 have a synonymic lexical relationship with a sixth object, a sixth verb, and a sixth modifier of a sixth description 418 and direct descendants 420, 422 of a common ancestor 424 of the fifth description 416 and the sixth description 418 are independent of one another. A type 3 conflict exists when two functions in a process function model are duplicates or near duplicates and have interdependent requirements. An example of a type 3 conflict would be two functions reading "control rudder angle," one of which serves the higher-level function of "steer ship," and the other serves the higher-level function of "aim cannons." These two functions create a conflict if and only if the higher-level functions of "steer ship" and "aim cannons" are able to occur independently of one another. A type 3 redundancy exists when two functions in a product function model are duplicates or near duplicates and have interdependent requirements. The type 3 redundancy may be equivalent to a type 1 redundancy.

Figure 5:
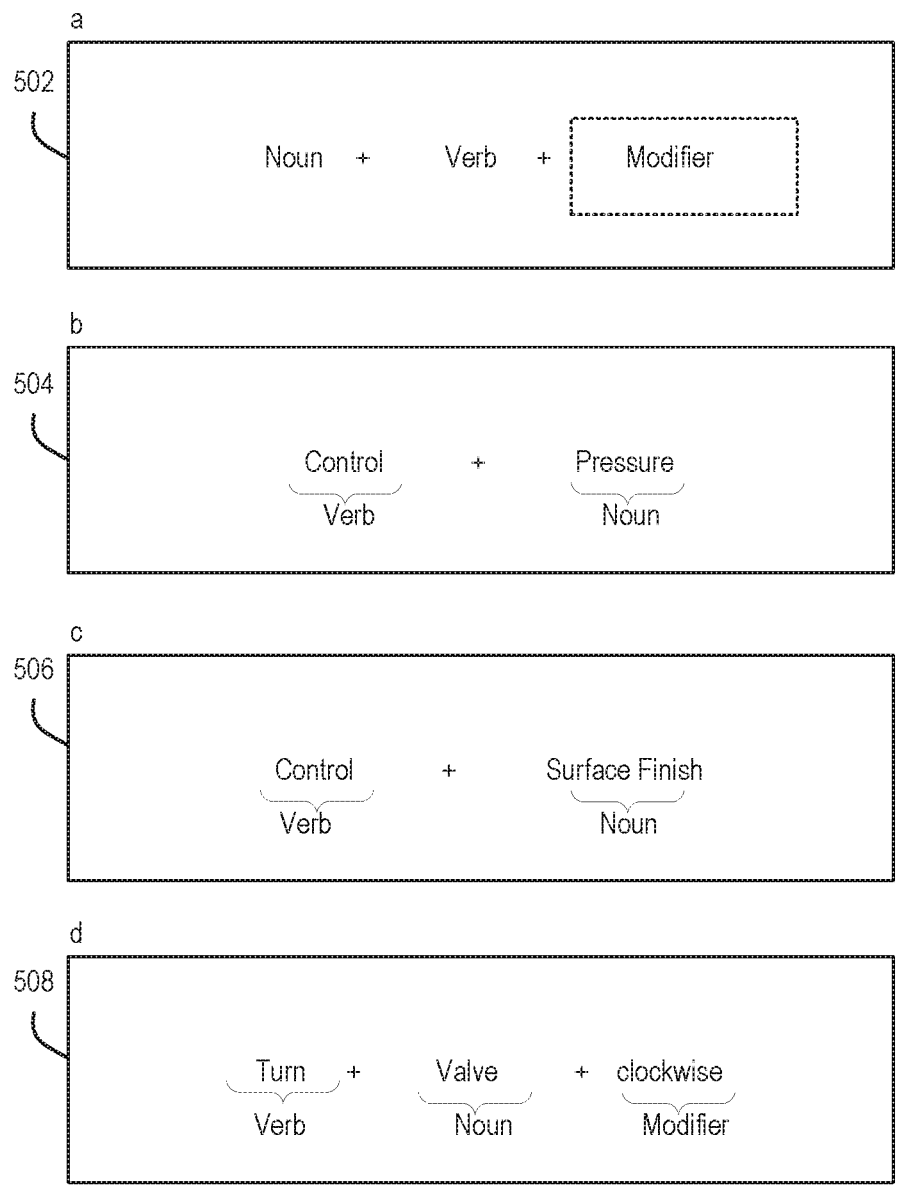
FIG. 5 is an example of three descriptions parsed into objects, verbs, and modifiers.

FIG. 5 is an example of three descriptions parsed into objects, verbs, and modifiers. As shown, generic description 502 may include a verb, noun, and modifier. The redundancy and conflict detection system may detect the noun verbs and modifiers by comparing the words to a list of nouns, verbs, and modifiers to find a match. The noun may be the object controlled by the verb. Some descriptions may lack a modifier. For example, a second description 504 includes a verb and a noun. In the second description 504 the noun is a single word. Some descriptions may include multiple words for the noun, verb or modifier. For example, a third description 506 includes a noun with more than one word. The redundancy and conflict detection system may detect the multiple word noun by comparing two or more words to a list of nouns to find a match. A fourth description 508 includes a function with a verb, noun, and modifier.

Figure 6A:
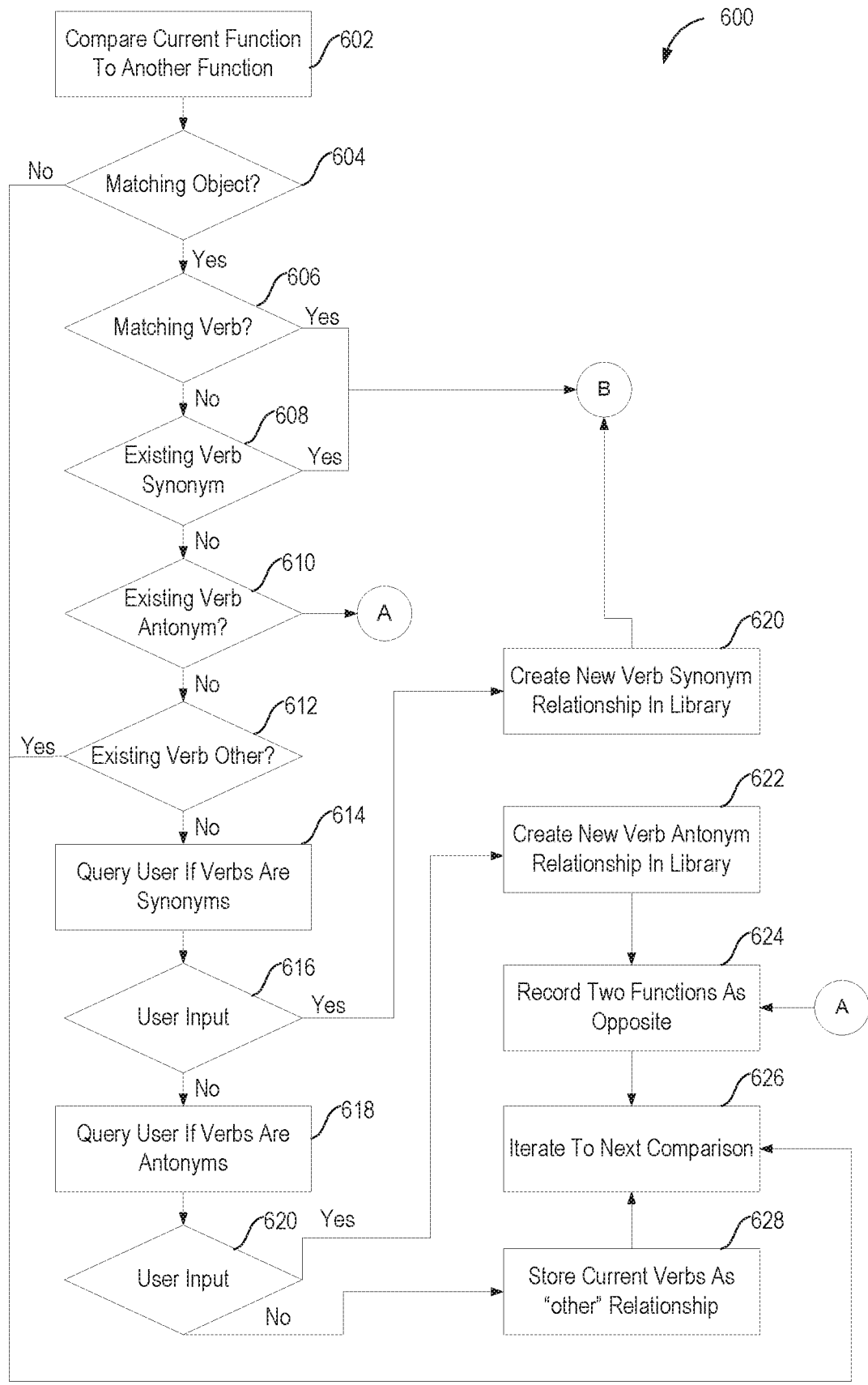
FIG. 6A is a first portion of a flow chart of a method for detecting redundancies and conflicts in a function model.
Figure 6B:
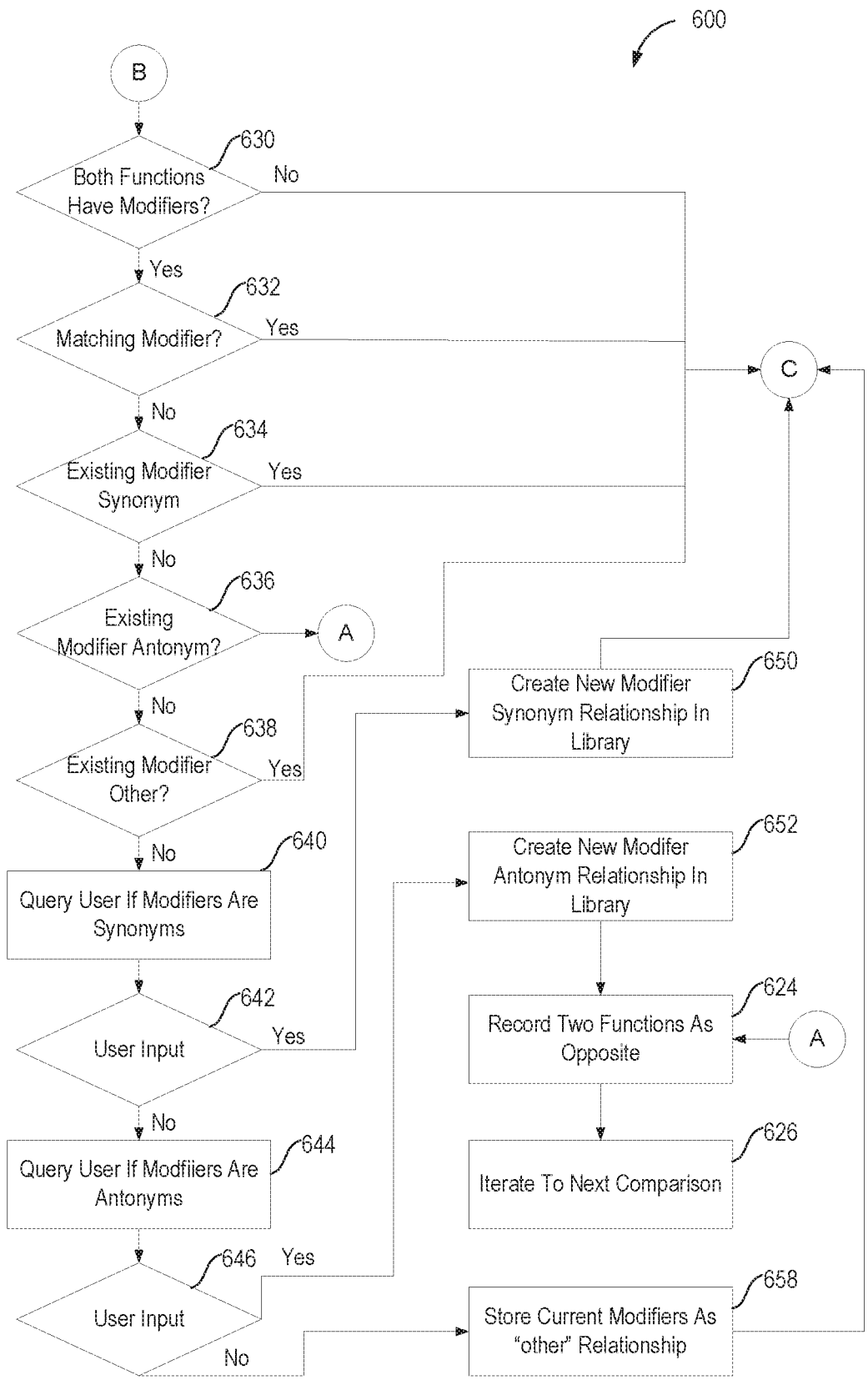
FIG. 6B is a second portion of a flow chart of a method for detecting redundancies and conflicts in a function model.
Figure 6C:
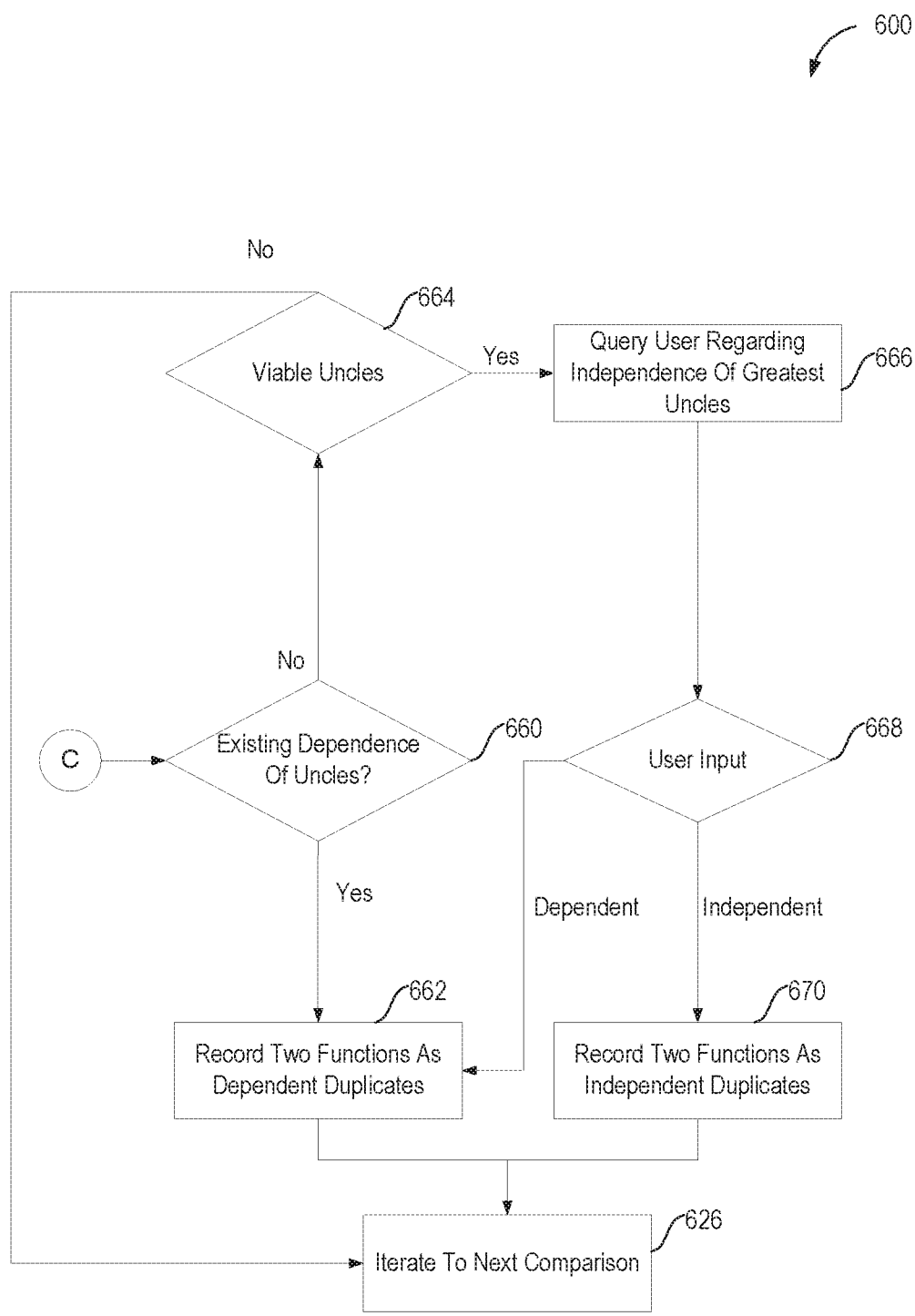
FIG. 6C is a third portion of a flow chart of a method for detecting redundancies and conflicts in a function model.

FIGS. 6A-6C illustrate a flow chart of a method 600 for detecting redundancies and conflicts in a function model. The method may be used by a redundancy and conflict detection system to compare 602 a current function description to another function description to determine the presence of a conflict or redundancy and a type of conflict or redundancy. The method may be used for detecting type 1, type 2, and type 3 functional interactions.

The system may determine a series of decisions to determine presence and type of redundancies and conflicts. The system may compare the objects and verbs of the functions as shown in FIG. 6A.

The system may determine 604 whether the objects (e.g., nouns) of the functions are matching. If the system determines that the objects of the functions do not match, the system iterates 626 to the next comparison and the functions would be determined to not be redundant or conflicting. If the system determines 604 that the objects of the functions do match, the system determines 606 if the verbs of the functions match. If the system determines that the verbs of the functions do not match, the system determines 608 if the verbs are synonyms in an existing library maintained by the system. If the system determines 606 that the functions do match or are synonyms, the system checks for the presence of modifiers and compares the modifiers.

The system may determine a lexical relationship by checking 608, 610 to see if the verbs are synonyms or antonyms in the existing library of lexical identifiers maintained by the system. The library of lexical identifiers may connect words as synonyms, antonyms, or unrelated (other). If the verb is a synonym, the system checks for the presence of modifiers and compares the modifiers. If the verb is an antonym, the system records 624 the two functions as antonyms. If the verb is neither an antonym nor a synonym, the system may check 612 the existing library to determine if the verbs have an "other" lexical relationship. The other lexical relationship may identify two words as lexically unrelated. Thus, if the two verbs are unrelated the system may not need to ask the user the lexical relationship; the system can simply iterate 626 to the next comparison.

However, if the verb is neither an antonym nor a synonym and the system does not have the verbs linked as non-related in the existing library, the system may use supervised machine learning to update the library and determine the lexical relationship between the functions. The system may query 614 a user whether verbs are synonyms. The system may receive 616 user input indicating if the verbs are synonymous. If the verbs are synonyms, the system creates 620 a new verb synonym relationship in the library. The system can use the new relationship in the library for future comparisons.

If the verbs are not synonyms, the system queries 618 the user to determine if the verbs are antonyms, and receives user input. If the user indicates that the verbs are not synonyms and are not antonyms, the system may store 628 the current verbs as having an unrelated relationship and iterate 626 to the next comparison. If the user indicates that the verbs are antonyms, the system creates a new verb antonym relationship in the library that can be used in future comparisons.

If the system determines objects are matching or synonymous and that the verbs are antonyms either through the existing library or through user input, the system may record 624 the two functions as opposite and iterate 626 to the next comparison. The system may flag these two functions as having a type 2 functional interaction. If the function model is a product function model, the system may present to the user, on a display device, information regarding a type 2 conflict between the two functions. If the function model is a process function model, the system may present to the user, on a display device, information regarding a type 2 redundancy between the two functions.

The system may further compare modifiers of the functions as shown in FIG. 6B. If the system determines that the objects of the functions do match and the verbs are matching or are synonyms, the system determines 630 if the functions both have modifiers. If the functions do not have modifiers, the system determines dependencies of hierarchal relationships of the functions as shown in FIG. 6C.

If the functions have modifiers, the system compares their lexical relationship. The system determines 632 if the modifiers of the functions match. If the system determines that the modifiers of the functions do not match, the system determines 634 if the modifiers are synonyms in an existing library maintained by the system. If the system determines that the functions do match or are synonyms, the system determines dependencies of hierarchal relationships of the functions as shown in FIG. 6C.

The system may determine a lexical relationship by checking 634, 668 to see if the modifiers are synonyms or antonyms in the existing library of lexical identifiers maintained by the system. The library of lexical identifiers may connect words as synonyms, antonyms, or unrelated (other). If the modifier is a synonym, the system determines dependencies of hierarchal relationships of the functions as shown in FIG. 6C.

If the modifier is an antonym, the system records 624 the two functions as opposites. If the modifier is neither an antonym nor a synonym, the system may check 638 the existing library to determine if the modifiers have an "other" lexical relationship. The other lexical relationship may identify two words as lexically unrelated. Thus, if the two modifiers are unrelated the system may not need to ask the user the lexical relationship, the system can simply iterate 626 to the next comparison.

However, if the modifier is neither an antonym nor a synonym and the system does not have the modifiers linked as non-related in the existing library, the system may use supervised machine learning to update the library and determine the lexical relationship between the functions. The system may query 640 a user whether modifiers are synonyms. The system may receive 642 user input indicating if the modifiers are synonymous. If the modifiers are synonyms, the system creates 650 a new modifier synonym relationship in the library. The system can use the new relationship in the library for future comparisons.

If the modifiers are not synonyms, the system queries 644 the user to determine if the modifiers are antonyms, and receives user input. If the user indicates that the modifiers are not synonyms and are not antonyms, the system may store 658 the current modifiers as having an unrelated relationship and iterate 626 to the next comparison. If the user indicates that the modifiers are antonyms, the system creates a new modifier antonym relationship in the library that can be used in future comparisons.

If the system determines objects are matching or synonymous and that the modifiers are antonyms either through the existing library or through user input, the system may record 624 the two functions as opposite and iterate 626 to the next comparison. The system may flag these two functions as having a type 2 functional interaction. If the function model is a product function model, the system may present to the user, on a display device, information regarding a type 2 conflict between the two functions. If the function model is a process function model, the system may present to the user, on a display device, information regarding a type 2 redundancy between the two functions.

FIG. 6C shows how the system determines dependencies of hierarchal relationships of the functions. The system determines 660 the existing dependence of uncles of the functions. That is, the system checks to see if the uncles have previously been identified as dependent. Uncles of functions are direct descendants of a common ancestor. If the existing uncles are dependent, the system records 663 the two functions as dependent duplicates and flags the functions as a type 1 redundancy.

The dependence may be determined by requesting user input to indicate the relationship. The system checks 664 if there are viable uncles that may be dependent. If there are no uncles, the system iterates 626 to the next comparison. If there are uncles for the functions, the system queries 666 the user regarding the independence of the greatest uncles, where the greatest uncles are the direct descendants of a common ancestor. The system receives 668 user input regarding the dependence. If the uncles are dependent, the system records 663 the two functions as dependent duplicates and flags the functions as a type 1 redundancy. If the uncles are independent, the system records 670 the two functions as independent duplicates and flags the functions as a type 3 redundancy or conflict. The system can display information regarding functional interactions (conflicts or redundancies) to the user for review.

Figure 7:
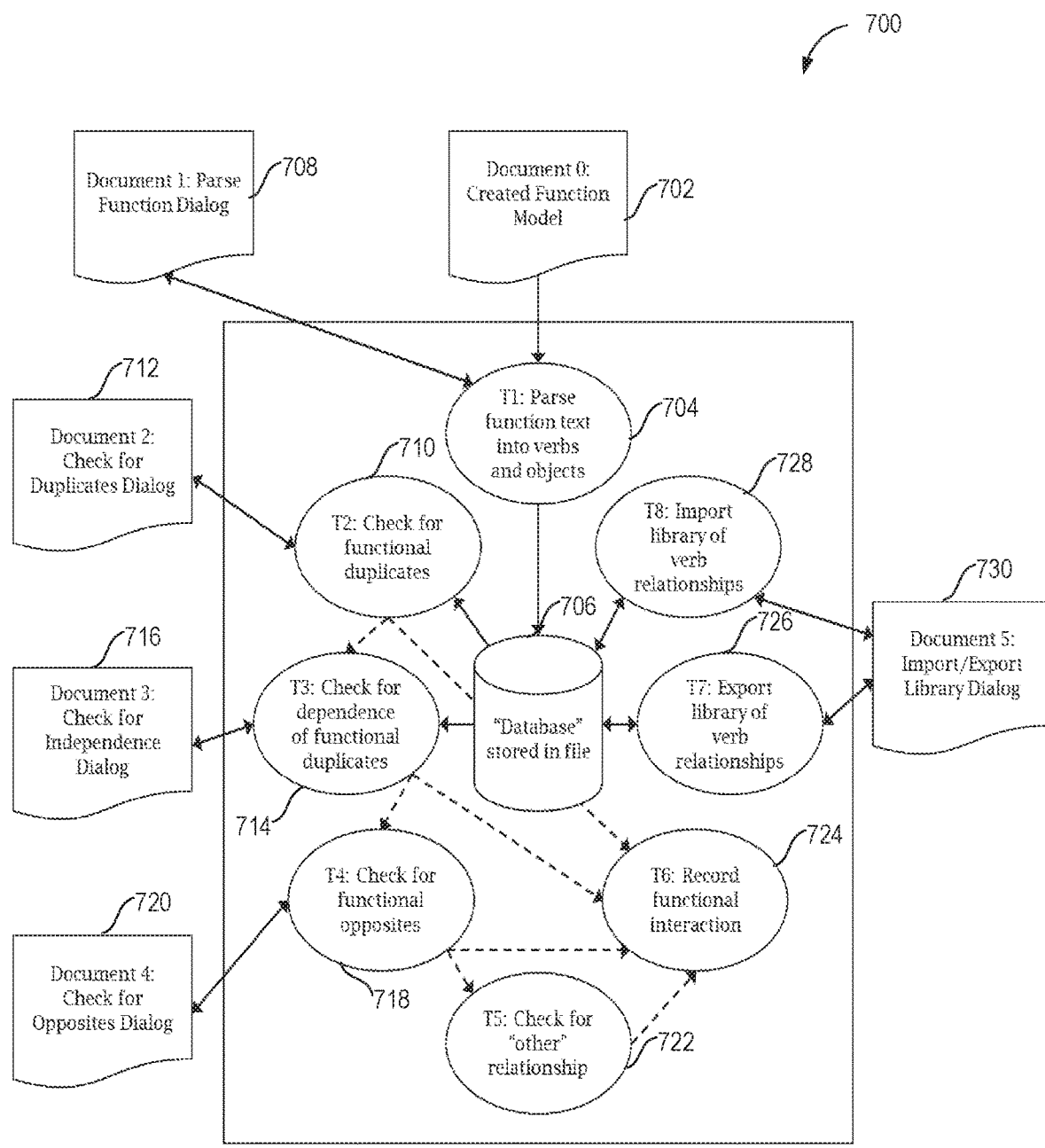
FIG. 7 is an information flow diagram of a redundancy and conflict detection system, according to one embodiment.

FIG. 7 is an information flow diagram 700 of a redundancy and conflict detection system. The system receives 702 a function model, and parses 704 the function model text into verbs, objects, and modifiers. The system parses the text using the database 706 which stores which category (verb, object, modifier) the words belong to. The system may also present 708 a graphical user interface (GUI) to a user to receive parsing instructions. For example, the GUI may allow the user to categorize unknown words and/or categorize words based on context. The user parsed words may be stored in the database 706 for future parsing. If two functions include matching objects, the system may determine lexical relationships and hierarchal relations to identify redundancies and conflicts within the function model.

The system may check 710 for functional duplicates of two functions within the function model. That is, the system may determine if the database 706 has a lexical relationship stored indicating that the verbs of two functions are matches or synonyms. The system may also use a GUI to check 712 for duplicates, and receive user input indicating that verbs are synonymous. The GUI may ask the user to classify whether or not the two verbs from the two functions that are being compared at a given time are synonymous. The system may record the user input into the database 706 for future use.

The system may check 710 for dependence of functional duplicates. The system may check whether uncles of the functions being compared are dependent. The system may determine this by referring to previously recorded dependencies in the database 706 or presenting a GUI to the user to check 716 for independence. The GUI may ask the user to classify whether the direct descendants of the common ancestor of the two functions being compared are dependent upon one another if the two functions being compared are synonymous.

The system may check 718 if functions being compared are opposites by referring to previously recorded antonyms in the database 706 or presenting a GUI to the user to check 720 for classification. The GUI may ask the user to classify whether or not the two verbs from the two functions being compared are antonymous, if the two verbs have already been declared to be not synonymous.

The system may also check 722 to see if there is a recording indicating an "other" relationship between the functions, such as unrelated. Based on the lexical relationship and hierarchal relationships of the two functions, the system may determine and record 734 a functional interaction (e.g., redundancy or conflict) for the two functions.

In some embodiments, the database 706 containing lexical relationships may be exported. In some embodiments a pre-existing library of lexical relationships may be imported 728 into the database. An import-export library dialog interface 730 may allow the user to import or export relationship libraries to or from the current function model.

FIG. 8 illustrates a GUI 800 that allows a user to assist in the parsing of a function model. A verb, noun, and modifier list may separate the text of the function model into the three categories. In some embodiments, the system may prepopulate the verb, noun, and modifier lists. In some embodiments, the GUI 800 asks the user to parse the text of each function in the function model into the function's key components of verb, noun and modifier. The user may alter the lists by dragging words between lists.

Figure 9:
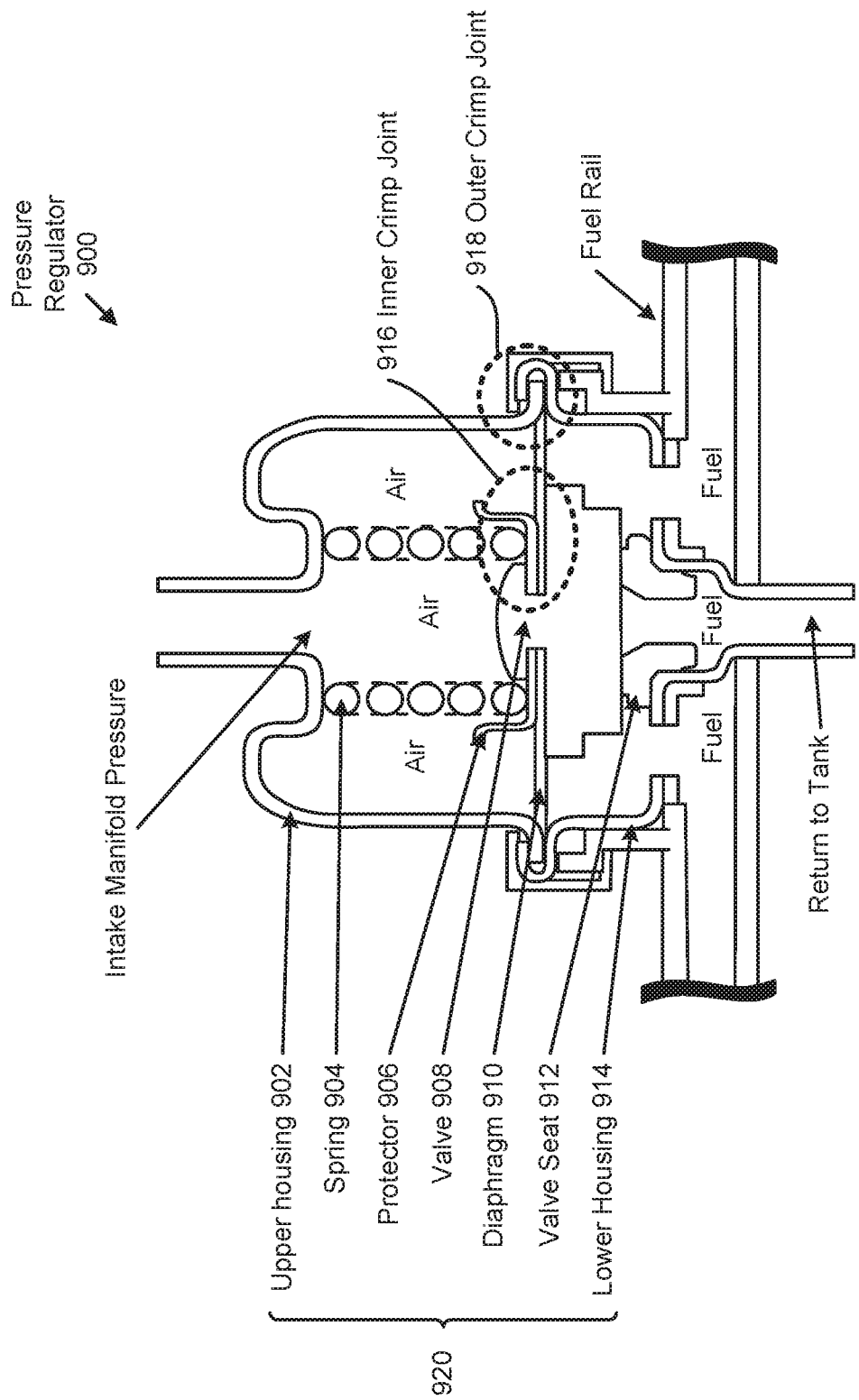
FIG. 9 illustrates a cross sectional view of a fuel pressure regulator.

FIG. 9 illustrates a cross sectional view of a fuel pressure regulator 900 and associated design component names 920 from a bill of material 202 for the fuel pressure regulator 900. The fuel pressure regulator 900 includes an upper housing 902, a spring 904, a protector, 906, a valve 908, a diaphragm 910, a valve seat 912, and a lower housing 914. In one embodiment, each of the components 902, 904, 906, 908, 910, 912, and 914 of the fuel pressure regulator 900 are listed by name on a corresponding bill of material. Similarly, any parts or portions formed from the components 902, 904, 906, 908, 910, 912, and 914 may also be included on the bill of material, or in a corresponding bill of process. For example, a peen tool used to form a part may also be listed on the bill of material or bill of process. Similarly, features that are formed during the assembly process or that are part of the materials may also be listed in the bill of process or bill of material. For example, the inner crimp joint 916 and/or the outer crimp joint 918 may be listed on the bill of material or bill of process as well.

FIGS. 10A-10F illustrate one embodiment of a function model 1000 for the fuel pressure regulator 900. Due to its size the function model 1000 is spread over multiple pages. The function model 1000 includes descriptions of functions for preventing fuel leaks from the fuel pressure regulator 900 of FIG. 9. In order to contain the fuel, the design requires a maximized inner and outer joint compression. At the same time to avoid damaging the diaphragm, the design requires minimized inner joint compression.

The descriptions of functions of the function model 1000 are organized to identify dependencies between functions. For example, descriptions at parent nodes correspond to functions that are stated more broadly and in relation to a purpose of a function while child nodes are stated more specifically and in relation to how a specific purpose or function is achieved (e.g., parent nodes indicate why and child nodes indicate how). Specifically, the functions "Contain Fuel at Inner Crimp Joint," "Prevent Diaphragm Permeation," and "Contain Fuel at Outer Crimp Joint" are all specific descriptions of functions to achieve the broader function of "Prevent Fuel Leaks" (see FIG. 10A).

Figure 10A:
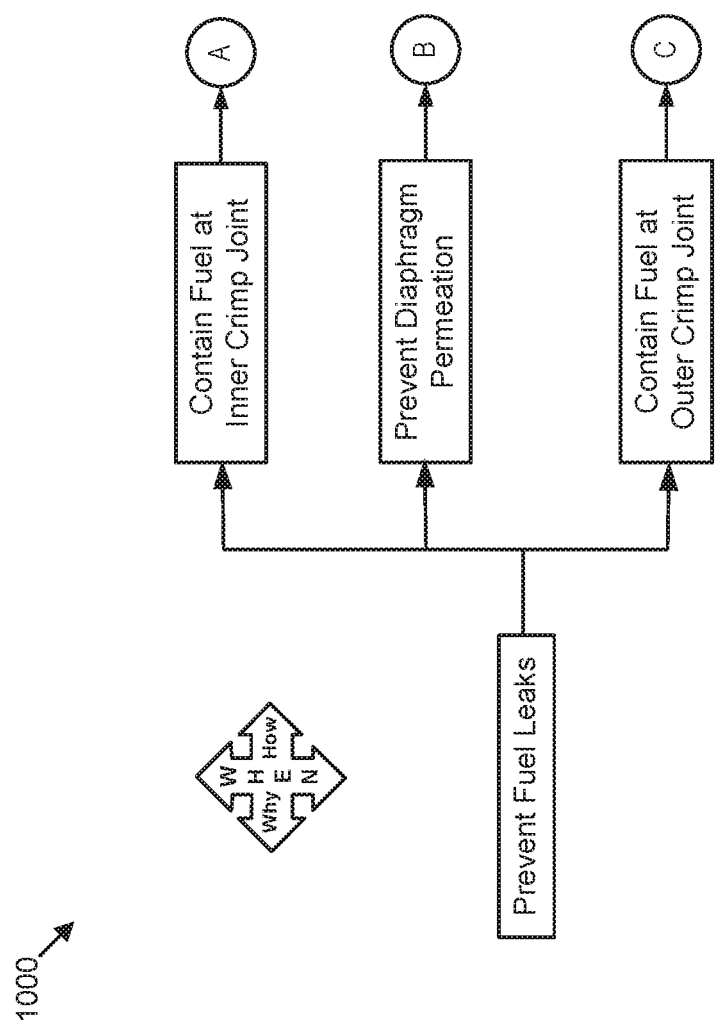
FIG. 10A illustrates a first portion of a function model for the fuel pressure regulator.
Figure 10B:
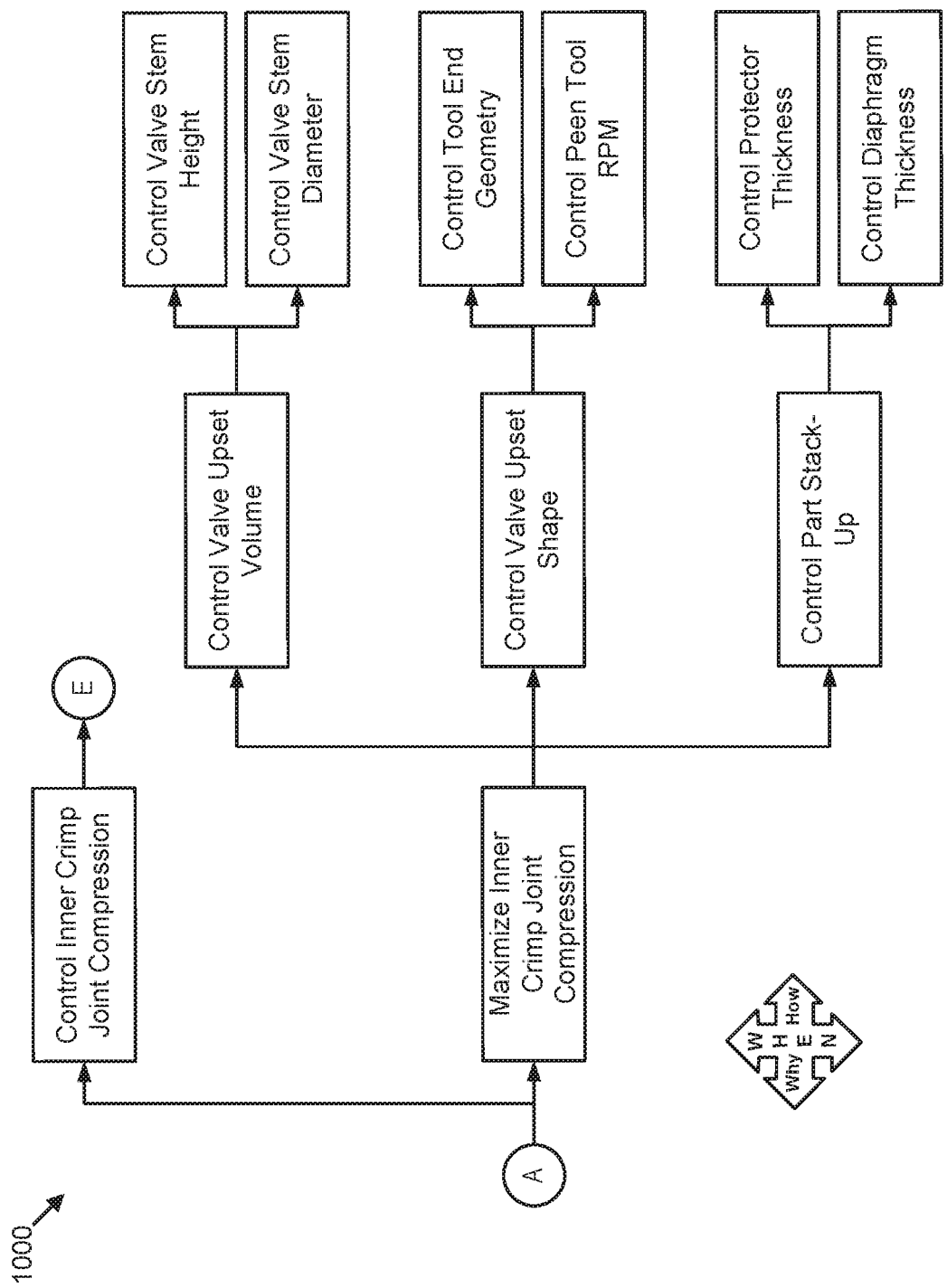
FIG. 10B illustrates a second portion of a function model for the fuel pressure regulator.
Figure 10C:
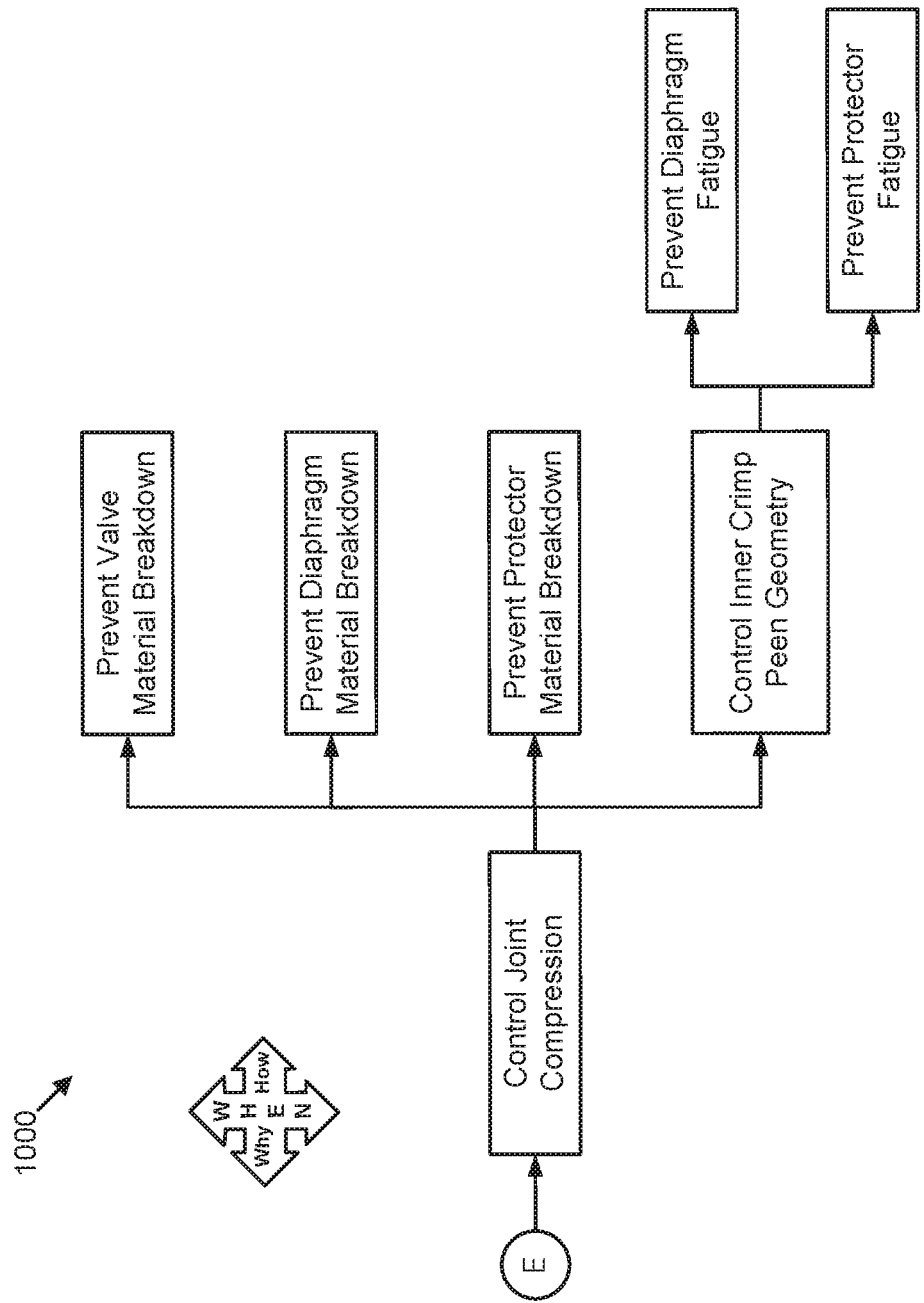
FIG. 10C illustrates a third portion of a function model for the fuel pressure regulator.
Figure 10D:
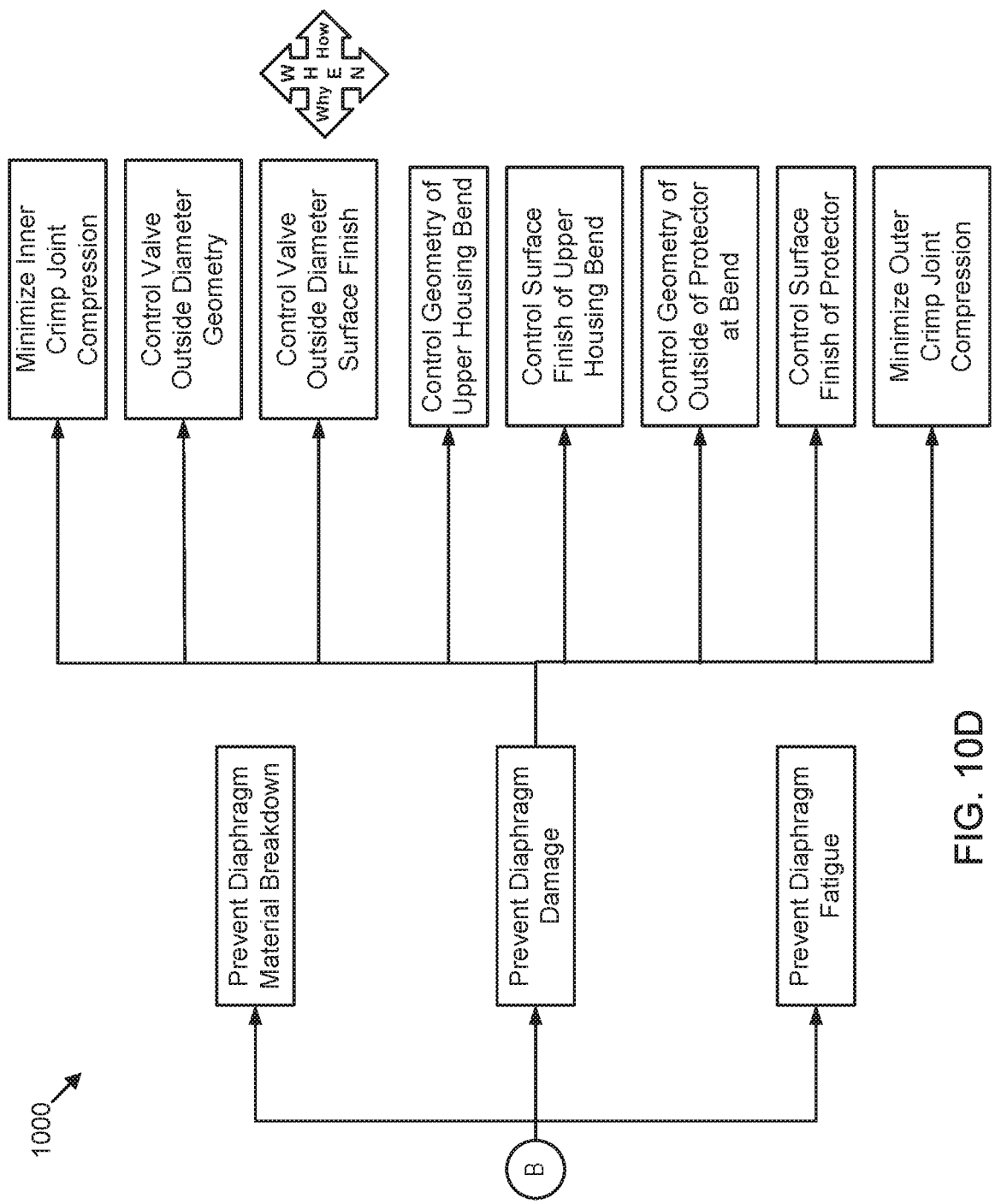
FIG. 10D illustrates a fourth portion of a function model for the fuel pressure regulator.
Figure 10E:
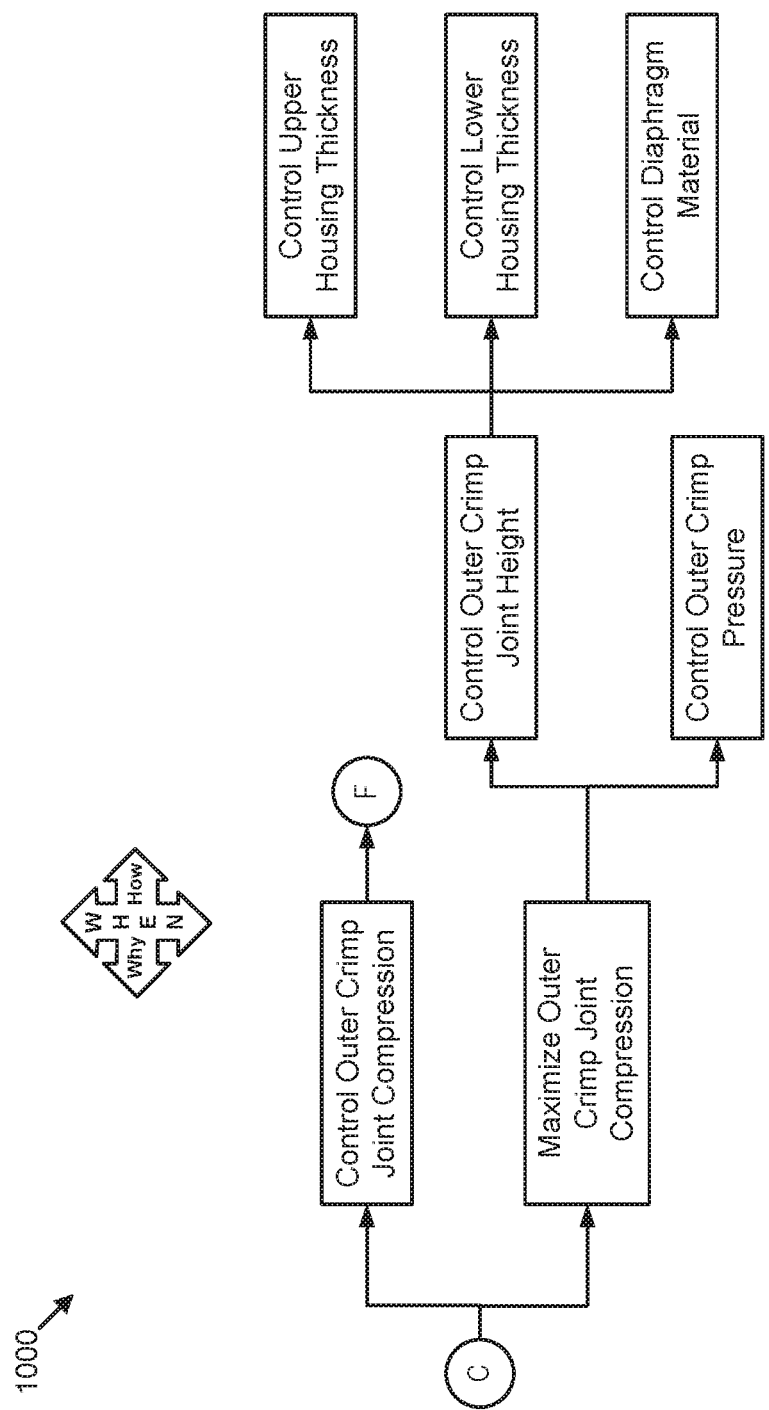
FIG. 10E illustrates a fifth portion of a function model for the fuel pressure regulator.
Figure 10F:
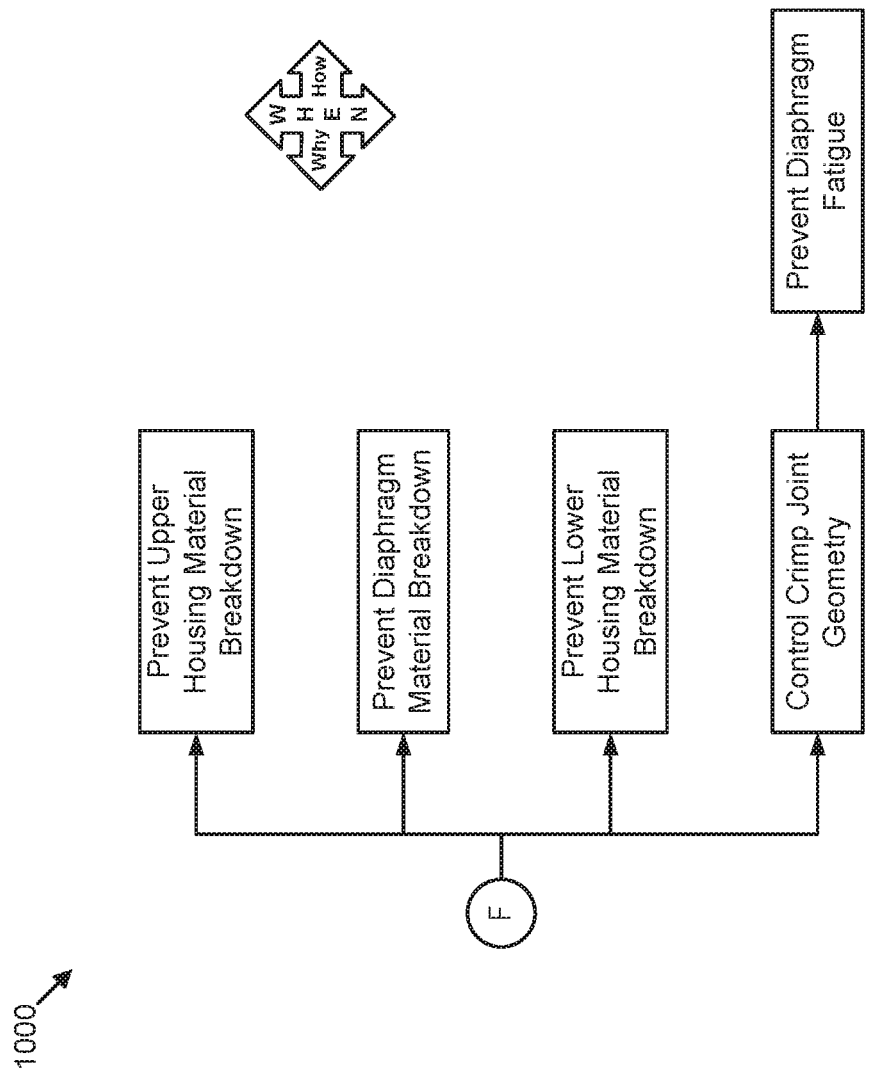
FIG. 10F illustrates a sixth portion of a function model for the fuel pressure regulator.

FIGS. 10B and 10C include specific functions and purposes to accomplish the broader "Contain Fuel at Inner Crimp Joint" function of FIG. 10A. FIG. 10D includes specific functions and purposes to accomplish the broader "Prevent Diaphragm Permeation" function of FIG. 10A. FIGS. 10E and 10F include functions and purposes to accomplish the broader "Contain Fuel at Outer Crimp Joint" function of FIG. 10A. These relationships and dependencies are indicated, in the depicted embodiment, by the position of a function with respect to other functions and by connectors between functions. For example, functions farther to the left (higher up in the hierarchy) are broader descriptions of why dependent functions to the right are performed. Functions farther to the right (lower down in the hierarchy) are more specific descriptions of how the parent functions to the left are accomplished.

Although the function model 1000 of FIGS. 10A-10F is illustrated as a schematic, information corresponding to the function model 1000 may be stored in a variety of formats within a file, database, or other storage structure which can be input into the redundancy and conflict detection system 100 of FIG. 1.

The redundancy and conflict detection system may use the method described with reference to FIGS. 6A-6C to determine conflicts and redundancies within the function model. For example, the system may process a function model of a system, product or process to identify descriptions of functions of the system, product, or process or functions of parts or components of the system, product, or process. The system may identify descriptions based on a format of the data structure, by processing text within the function model to identify separate functions, or the like.

The system may parse the function model into a number of different descriptions that can then be processed to determine lexical relationships. In one embodiment, the system parses each description into separate parts. For example, the system may parse each description into a design component name, an active verb, and a modifier. The system may search each description for a term from one or more of the bill of material, noun list, verb list, and modifier list to locate any design component names, active verbs, or modifiers in the description.

In one embodiment, the system identifies descriptions of the function model and places them within an alternate format, such as a table format, a function map format, a graphical format, or any other graphical structure or data structure. For example, the system may parse the function model into separate descriptions and/or parse the descriptions into separate terms. These parsed versions of the function model and/or descriptions may then be processed to determine redundancies and conflicts, lexical relationships, hierarchal relationships, or other information. The system may output results of a conflict and redundancy check to a display.

FIG. 11 illustrates an output of a redundancy and conflict detection system according to one embodiment. The output includes a redundancy and conflict table 1100 that provides information on the conflict type and the related functions. The redundancy and conflict table 1100 may indicate the location of the functions in the model, the text of the functions, and the type of conflict or redundancy. In some embodiments, the redundancy and conflict table 1100 may include a column indicating that if the functions are part of a product function model the functions would be in conflict or redundant. In some embodiments, the redundancy and conflict table 1100 may include a column indicating that if the functions are part of a process function model the functions would be in conflict or redundant.

EXAMPLE EMBODIMENTS

The following are some example embodiments within the scope of the disclosure. In order to avoid complexity in providing the disclosure, not all of the examples listed below are separately and explicitly disclosed as having been contemplated herein as combinable with all of the others of the examples listed below and other embodiments disclosed hereinabove. Unless one of ordinary skill in the art would understand that these examples listed below (and the above disclosed embodiments) are not combinable, it is contemplated within the scope of the disclosure that such examples and embodiments are combinable.

Example 1. A real-time hydraulic representation system comprising: a memory to store: a function model of a product or process to identify a plurality of descriptions of functions to be performed by the product or process, the function model identifying dependencies between the functions, and a set of lexical identifiers that classify objects, verbs, and modifiers as synonyms, antonyms, or not related; and a processer to: parse the plurality of descriptions of functions to identify objects, verbs, and modifiers corresponding to descriptions of the plurality of descriptions; determine lexical relationships between the identified objects, verbs, and modifiers based on the lexical identifiers stored in the memory; determine dependencies of hierarchal relationships within the function model; detect a first redundancy type within the function model when: a first object, a first verb, and a first modifier of a first description have a synonymic lexical relationship with or matching with a second object, a second verb, and a second modifier of a second description, and direct descendants of a common ancestor of the first description and the second description are dependent upon one another; and cause information regarding the first redundancy type to be displayed on a display device.

Example 2. The system of example 1, wherein the processor is further to determine whether the function model is a product function model or a process function model.

Example 3. The system of example 2, wherein the processor is further to detect a second redundancy type within the function model when: a third object of a third description matches a fourth object of a fourth description; a third verb of the third description has an antonymic lexical relationship with a fourth verb of the fourth description; and the function model is the process function model.

Example 4. The system of example 2, wherein the processor is further to detect a conflict within the function model when: a third object of a third description matches a fourth object of a fourth description; a third verb of the third description has an antonymic lexical relationship with a fourth verb of the fourth description; and the function model is the product function model.

Example 5. The system of example 2, wherein the processor is further to detect a third redundancy type within the function model when: a third object, a third verb, and a third modifier of a third description have a second synonymic lexical relationship or matching with a fourth object, a fourth verb, and a fourth modifier of a fourth description; direct descendants of a common ancestor of the third description and the fourth description are independent of one another; and the function model is the process function model.

Example 6. The system of example 2, wherein the processor is further to detect a conflict within the function model when: a third object, a third verb, and a third modifier of a third description have a second synonymic lexical relationship with or matching with a fourth object, a fourth verb, and a fourth modifier of a fourth description; direct descendants of a common ancestor of the third description and the fourth description are independent of one another; and the function model is the product function model.

Example 7. The system of example 2, wherein the processor is further to update the set of lexical identifiers based on user input.

Example 8. A method for detecting design redundancies of a product or process, the method comprising: processing, using a processor, a function model of a product or process to identify a plurality of descriptions of functions to be performed by the product or process, the function model identifying dependencies between the functions; parsing, using the processor, the plurality of descriptions of the functions to identify objects, verbs, and modifiers corresponding to each description of the plurality of descriptions; accessing a database containing a set of lexical identifiers that classify the objects, verbs, and modifiers as synonyms or antonyms; detecting, using the processor, in the plurality of descriptions a first description that comprises a first object, a first verb, and a first modifier that are respectively classified, by the set of lexical identifiers, as synonyms with or matching a second object, a second verb, and a second modifier of a second description; determining, using the processor, that direct descendants of a common ancestor of the first description and the second description are dependent upon one another; flagging, using the processor, a relationship between the first description and the second description as a first redundancy type; and displaying, on a display device, information regarding the first redundancy type.

Example 9. The method of example 8, further comprising determining whether the function model is a product function model or a process function model.

Example 10. The method of example 9, further comprising detecting a second redundancy type within the function model when: a third object of a third description matches a fourth object of a fourth description; a third verb of the third has an antonymic lexical relationship with a fourth verb of the fourth description; and the function model is the process function model.

Example 11. The method of example 9, further comprising detecting a conflict within the function model when: a third object of a third description matches a fourth object of a fourth description; a third verb of the third description has an antonymic lexical relationship with a fourth verb of the fourth description; and the function model is the product function model.

Example 12. The method of example 9, further comprising detecting a third redundancy type within the function model when: a third object, a third verb, and a third modifier of a third description have a second synonymic lexical relationship with or matching a fourth object, a fourth verb, and a fourth modifier of a fourth description; and the function model is the process function model.

Example 13. The method of example 9, further comprising detecting a conflict within the function model when: a third object, a third verb, and a third modifier of a third description have a second synonymic lexical relationship with or matching a fourth object, a fourth verb, and a fourth modifier of a fourth description; and the function model is the product function model.

Example 14. The method of example 8, further comprising updating the set of lexical identifiers based on user input.

Example 15. A system for detecting design redundancies of a product or process, the system comprising: a memory to store: a function model of a product or process to identify a plurality of descriptions of functions to be performed by the product or process, the function model identifying dependencies between the functions; a processor to: identify a plurality of descriptions of functions within the function model; parse the plurality of descriptions of the functions to identify objects, verbs, and modifiers; detect, in the plurality of descriptions, a first description that comprises a first object, a first verb, and a first modifier that matches with a second object, a second verb, and a second modifier of a second description; determine that direct descendants of a common ancestor of the first description and the second description are dependent upon one another; flag a relationship between the first description and the second description as a first redundancy type; and cause information regarding the first redundancy type to be displayed on a display device.

Example 16. The system of example 15, wherein to parse the plurality of descriptions the processor renders an interface to receive user input classifying text of the plurality of descriptions as a verb, noun, or modifier.

Example 17. The system of example 15, wherein the processor is further to determine whether the function model is a product function model or a process function model.

Example 18. The system of example 17, wherein the processor is further to detect a second redundancy type within the function model when: a third object of a third description matches a fourth object of a fourth description; a third verb of the third description is a functional opposite of a fourth verb of the fourth description; and the function model is the process function model.

Example 19. The system of example 17, wherein the processor is further to detect a conflict within the function model when: a third object of a third description matches a fourth object of a fourth description; a third verb of the third description has an antonymic lexical relationship with a fourth verb of the fourth description; and the function model is the product function model.

Example 20. The system of example 17, wherein the processor is further to detect a conflict within the function model when: a third object, a third verb, and a third modifier of a third description have a second synonymic lexical relationship with or matching a fourth object, a fourth verb, and a fourth modifier of a fourth description; and the function model is the product function model.

Some of the components that can be used with embodiments disclosed herein are already available, such as general-purpose computers, mobile phones, computer programming tools and techniques, digital storage media, and communications networks. A computing device, such as a laptop, tablet computer, desktop computer, server, Smartphone, or the like, may include a processor, such as a microprocessor, microcontroller, logic circuitry, or the like. The processor may include a special purpose processing device such as an ASIC, PAL, PLA, PLD, FPGA, or other customized or programmable device. The computing device may also include a computer-readable storage device such as non-volatile memory, static RAM, dynamic RAM, ROM, CD-ROM, disk, tape, magnetic, optical, flash memory, or other computer-readable storage medium.

Various aspects of certain embodiments may be implemented using hardware, software, firmware, or a combination thereof. As used herein, a software component may include any type of computer instruction or computer executable code located within or on a non-transitory computer-readable storage medium. A software component may, for instance, comprise one or more physical or logical blocks of computer instructions, which may be organized as a routine, program, object, component, data structure, etc., that performs one or more tasks or implements particular abstract data types.

In certain embodiments, a particular software component may comprise disparate instructions stored in different locations of a computer-readable storage medium, which together implement the described functionality of the component. Indeed, a component may comprise a single instruction or many instructions, and may be distributed over several different code segments, among different programs, and across several computer-readable storage media. Some embodiments may be practiced in a distributed computing environment where tasks are performed by a remote processing device linked through a communications network.

The systems and methods disclosed herein are not inherently related to any particular computer or other apparatus and may be implemented by a suitable combination of hardware, software, and/or firmware. Software implementations may include one or more computer programs comprising executable code/instructions that, when executed by a processor, may cause the processor to perform a method defined at least in part by the executable instructions. The computer program can be written in any form of programming language, including compiled or interpreted languages, and can be deployed in any form, including as a standalone program or as a module, component, subroutine, or other unit suitable for use in a computing environment. Further, a computer program can be deployed to be executed on one computer or on multiple computers at one site or distributed across multiple sites and interconnected by a communication network.

Software embodiments may be implemented as a computer program product that comprises a non-transitory storage medium configured to store computer programs and instructions that, when executed by a processor, are configured to cause the processor to perform a method according to the instructions. In certain embodiments, the non-transitory storage medium may take any form capable of storing processor-readable instructions on a non-transitory storage medium. A non-transitory storage medium may be embodied by a compact disk, digital-video disk, a magnetic tape, a Bernoulli drive, a magnetic disk, a punch card, flash memory, integrated circuits, or any other non-transitory digital processing apparatus memory device.

Although the foregoing has been described in some detail for purposes of clarity, it will be apparent that certain changes and modifications may be made without departing from the principles thereof. It should be noted that there are many alternative ways of implementing the processes, apparatuses, and system described herein. Accordingly, the present embodiments are to be considered illustrative and not restrictive, and the invention is not to be limited to the details given herein, but may be modified within the scope and equivalents of the appended claims.

As used herein, the terms "comprises," "comprising," and any other variation thereof are intended to cover a non-exclusive inclusion, such that a process, a method, an article, or an apparatus that comprises a list of elements does not include only those elements but may include other elements not expressly listed or inherent to such process, method, system, article, or apparatus.

It will be apparent to those having skill in the art that many changes may be made to the details of the above-described embodiments without departing from the underlying principles of the invention. The scope of the present invention should, therefore, be determined only by the following claims.

The invention claimed is:

1. A real-time hydraulic representation system comprising:
    a memory to store:
        a function model of a product or process to identify a plurality of descriptions of functions to be performed by the product or process, the function model identifying dependencies between the functions, and
        a set of lexical identifiers that classify objects, verbs, and modifiers as synonyms, antonyms, or not related; and
    a processor to:
        parse the plurality of descriptions of functions to identify objects, verbs, and modifiers corresponding to descriptions of the plurality of descriptions;
        determine lexical relationships between the identified objects, verbs, and modifiers based on the lexical identifiers stored in the memory;
        determine dependencies of hierarchical relationships within the function model;
        detect a first redundancy type within the function model when both:
            a) a first object, a first verb, and a first modifier of a first description have a synonymic lexical relationship with or matching with a second object, a second verb, and a second modifier of a second description, and
            b) direct descendants of a common ancestor of the first description and the second description are dependent upon one another, wherein the direct descendants comprise functions with a hierarchical position between the common ancestor and the first description and the second description such that the direct descendants are uncles to the first description and the second description; and
        cause information regarding the first redundancy type to be displayed on a display device.

2. The system of claim 1, wherein the processor is further to determine whether the function model is a product function model or a process function model.

3. The system of claim 2, wherein the processor is further to detect a second redundancy type within the function model when:
    a third object of a third description matches a fourth object of a fourth description;
    a third verb of the third description has an antonymic lexical relationship with a fourth verb of the fourth description; and
    the function model is the process function model.

4. The system of claim 2, wherein the processor is further to detect a conflict within the function model when:
    a third object of a third description matches a fourth object of a fourth description;
    a third verb of the third description has an antonymic lexical relationship with a fourth verb of the fourth description; and
    the function model is the product function model.

5. The system of claim 2, wherein the processor is further to detect a third redundancy type within the function model when:
- a third object, a third verb, and a third modifier of a third description have a second synonymic lexical relationship or matching with a fourth object, a fourth verb, and a fourth modifier of a fourth description;
- direct descendants of a common ancestor of the third description and the fourth description are independent of one another; and
- the function model is the process function model.

6. The system of claim 2, wherein the processor is further to detect a conflict within the function model when:
- a third object, a third verb, and a third modifier of a third description have a second synonymic lexical relationship with or matching with a fourth object, a fourth verb, and a fourth modifier of a fourth description;
- direct descendants of a common ancestor of the third description and the fourth description are independent of one another; and
- the function model is the product function model.

7. The system of claim 2, wherein the processor is further to update the set of lexical identifiers based on user input.

8. A method for detecting design redundancies of a product or process, the method comprising:
- processing, using a processor, a function model of a product or process to identify a plurality of descriptions of functions to be performed by the product or process, the function model identifying dependencies between the functions;
- parsing, using the processor, the plurality of descriptions of the functions to identify objects, verbs, and modifiers corresponding to each description of the plurality of descriptions;
- accessing a database containing a set of lexical identifiers that classify the objects, verbs, and modifiers as synonyms or antonyms;
- detecting, using the processor, in the plurality of descriptions a first description that comprises a first object, a first verb, and a first modifier that are respectively classified, by the set of lexical identifiers, as synonyms with or matching a second object, a second verb, and a second modifier of a second description;
- determining, using the processor, that direct descendants of a common ancestor of the first description and the second description are dependent upon one another, wherein the direct descendants comprise functions with a hierarchical position between the common ancestor and the first description and the second description such that the direct descendants are uncles to the first description and the second description;
- flagging, using the processor, a relationship between the first description and the second description as a first redundancy type when both:
  a) the direct descendants are dependent upon one another, and
  b) the first object, the first verb, and the first modifier are synonyms with or matching the second object, the second verb, and the second modifier; and
- displaying, on a display device, information regarding the first redundancy type.

9. The method of claim 8, further comprising determining whether the function model is a product function model or a process function model.

10. The method of claim 9, further comprising detecting a second redundancy type within the function model when:
- a third object of a third description matches a fourth object of a fourth description;
- a third verb of the third description has an antonymic lexical relationship with a fourth verb of the fourth description; and
- the function model is the process function model.

11. The method of claim 9, further comprising detecting a conflict within the function model when:
- a third object of a third description matches a fourth object of a fourth description;
- a third verb of the third description has an antonymic lexical relationship with a fourth verb of the fourth description; and
- the function model is the product function model.

12. The method of claim 9, further comprising detecting a third redundancy type within the function model when:
- a third object, a third verb, and a third modifier of a third description have a second synonymic lexical relationship with or matching a fourth object, a fourth verb, and a fourth modifier of a fourth description; and
- the function model is the process function model.

13. The method of claim 9, further comprising detecting a conflict within the function model when:
- a third object, a third verb, and a third modifier of a third description have a second synonymic lexical relationship with or matching a fourth object, a fourth verb, and a fourth modifier of a fourth description; and
- the function model is the product function model.

14. The method of claim 8, further comprising updating the set of lexical identifiers based on user input.

15. A system for detecting design redundancies of a product or process, the system comprising:
- a memory to store:
  - a function model of a product or process to identify a plurality of descriptions of functions to be performed by the product or process, the function model identifying dependencies between the functions;
- a processor to:
  - identify a plurality of descriptions of functions within the function model;
  - parse the plurality of descriptions of the functions to identify objects, verbs, and modifiers;
  - detect, in the plurality of descriptions, a first description that comprises a first object, a first verb, and a first modifier that matches with a second object, a second verb, and a second modifier of a second description;
  - determine that direct descendants of a common ancestor of the first description and the second description are dependent upon one another, wherein the direct descendants comprise functions with a hierarchical position between the common ancestor and the first description and the second description such that the direct descendants are uncles to the first description and the second description;
  - flag a relationship between the first description and the second description as a first redundancy type when both:
    a) the direct descendants are dependent upon one another, and
    b) the first object, the first verb, and the first modifier are synonyms with or matching the second object, the second verb, and the second modifier; and
  - cause information regarding the first redundancy type to be displayed on a display device.

16. The system of claim 15, wherein to parse the plurality of descriptions the processor renders an interface to receive user input classifying text of the plurality of descriptions as a verb, noun, or modifier.

17. The system of claim 15, wherein the processor is further to determine whether the function model is a product function model or a process function model.

18. The system of claim 17, wherein the processor is further to detect a second redundancy type within the function model when:
   a third object of a third description matches a fourth object of a fourth description;
   a third verb of the third description is a functional opposite of a fourth verb of the fourth description; and
   the function model is the process function model.

19. The system of claim 17, wherein the processor is further to detect a conflict within the function model when:
   a third object of a third description matches a fourth object of a fourth description;
   a third verb of the third description has an antonymic lexical relationship with a fourth verb of the fourth description; and
   the function model is the product function model.

20. The system of claim 17, wherein the processor is further to detect a conflict within the function model when:
   a third object, a third verb, and a third modifier of a third description have a second synonymic lexical relationship with or matching a fourth object, a fourth verb, and a fourth modifier of a fourth description; and
   the function model is the product function model.

* * * * *